US007943488B2

(12) United States Patent
Yonehara

(10) Patent No.: US 7,943,488 B2
(45) Date of Patent: May 17, 2011

(54) TRANSFER METHOD OF FUNCTIONAL REGION, LED ARRAY, LED PRINTER HEAD, AND LED PRINTER

(75) Inventor: Takao Yonehara, Kawasaki (JP)

(73) Assignee: Canon Kabushiki Kaisha, Toyko (JP)

( * ) Notice: Subject to any disclaimer, the term of this patent is extended or adjusted under 35 U.S.C. 154(b) by 57 days.

(21) Appl. No.: 12/611,761

(22) Filed: Nov. 3, 2009

(65) Prior Publication Data

US 2010/0109023 A1 May 6, 2010

(30) Foreign Application Priority Data

Nov. 4, 2008 (JP) ................. 2008-282681

(51) Int. Cl.
*H01L 21/52* (2006.01)
*H01L 21/00* (2006.01)

(52) U.S. Cl. .......... 438/458; 438/30; 438/149; 438/421; 438/455; 438/459; 438/460; 438/462; 438/690; 257/84; 257/88; 257/258; 257/288; 257/E21.211; 257/E21.409; 257/E21.482; 257/E33.001

(58) Field of Classification Search ............... 438/30, 438/149, 421, 455, 459, 460, 462, 458, 690; 257/84, 88, 256, 288, E21.211, E21.409, 257/E21.482, E33.001
See application file for complete search history.

(56) References Cited

U.S. PATENT DOCUMENTS

| 6,913,985 | B2 | 7/2005 | Ogihara | |
|---|---|---|---|---|
| 7,704,765 | B2* | 4/2010 | Maruyama et al. | 438/30 |
| 2001/0012677 | A1* | 8/2001 | Sameshima | 438/458 |
| 2005/0059219 | A1* | 3/2005 | Tayanaka | 438/458 |
| 2006/0246636 | A1* | 11/2006 | Imai et al. | 438/149 |
| 2010/0165446 | A1* | 7/2010 | Danner et al. | 359/296 |

FOREIGN PATENT DOCUMENTS

| JP | 2003-174041 A | 6/2003 |
|---|---|---|
| JP | 2004-311765 A | 11/2004 |
| JP | 2006-53171 A | 2/2006 |

* cited by examiner

*Primary Examiner* — Dao H Nguyen

(74) *Attorney, Agent, or Firm* — Canon U.S.A., Inc. IP Division

(57) ABSTRACT

A method includes placing a first bonding layer on at least one of a first functional region bonded on a release layer with a light releasable adhesive layer on a first substrate, and a transfer region on a second substrate; bonding the first functional region to the second substrate by the first bonding layer; irradiating the release layer with light with a light blocking member being provided to separate the first substrate from the first functional region at the release layer; placing a second bonding layer on at least one of a second functional region on the first substrate, and a transfer region on the release layer or a transfer region on a third substrate; bonding the second functional region to the second substrate or the third substrate by the second bonding layer; and separating the first substrate from the second functional region at the release layer.

17 Claims, 19 Drawing Sheets

▭ Spacer, width d
▯ CMOS chip

▭ LED Epi Isl.

TRANSFER METHOD OF FUNCTIONAL REGION, LED ARRAY, LED PRINTER HEAD, AND LED PRINTER

BACKGROUND OF THE INVENTION

1. Field of the Invention

The present invention relates to methods of a functional region for fabrication of semiconductor members, semiconductor products, semiconductor devices, and the like. Further, the present invention relates to light emitting diode (LED) arrays, LED printer heads, and LED printers fabricated by the transfer method.

2. Related Background Art

Techniques of transferring, to a silicon substrate, constituent layers of a light emitting diode formed on a GaAs substrate via a sacrificial layer are known. U.S. Pat. No. 6,913, 985 discloses such technology. More specifically, constituent layers of the light emitting diode deposited on the GaAs substrate via the sacrificial layer is initially divided into plural light emitting regions by forming grooves therein. The sacrificial layer is exposed to the groove. Then, a dry film resist is attached to constituent layers of the light emitting diode, and a support member of a mesh metal wire is bonded on the dry film resist.

Thereafter, portions of the resist other than portions right under the mesh metal wire are removed. The sacrificial layer is brought into contact with an etchant through the mesh support member to etch the sacrificial layer. Thus, the GaAs substrate is separated from the composite structure. Further, after separation of the GaAs substrate, a silicon substrate is bonded on the light emitting diode with constituent layers. The light emitting diode with constituent layers is transferred to the silicon substrate.

Japanese Patent Laid-open No. 2003-174041 discloses techniques of placing a chip portion selected from plural semiconductor chips formed on a substrate onto another substrate. More specifically, a first laminated layer structure with a device layer formed on a first substrate is prepared, and a second laminated layer structure with a release layer formed on a second substrate is prepared. Then, facing the device layer and the release layer to each other, the first laminated layer structure and the second laminated layer structure are bonded. The laminated layer structure including the device layer and the release layer is divided into plural portions in a predetermined pattern. Thus, plural chips including devices are formed on the second substrate. A predetermined chip selected from the plural chips is bonded to a predetermined position on a third substrate. Thereafter, the second substrate is separated from the selected chip at the release layer, and the selected chip is thus placed on the third substrate.

Where an LED array or the like is produced by using a compound semiconductor, such as GaAs, on a GaAs substrate, an efficient use of the GaAs substrate is beneficial because the GaAs substrate is expensive compared to the silicon substrate. Further, where the size of the GaAs substrate (for example, 2, 4, 6, or 8-inch substrate) is different from the size of the silicon substrate (for example, 4, 5, 6, 8, or 12-inch substrate), a transferable region is a region of the smaller substrate when the transfer is performed collectively or all at once per a unit of substrate. Accordingly, in order to attain an efficient transfer, sizes of both substrates with the size of the smaller one are to be accorded.

Where the transfer is performed in such a manner as disclosed in U.S. Pat. No. 6,913,985, a usable GaAs semiconductor layer is only a portion corresponding to a device formed on the silicon substrate. Thus, GaAs semiconductor corresponding to a portion between devices on the silicon substrate is abandoned without being used.

The above-described situation will be described with reference to FIGS. 19A and 19B. FIGS. 19A and 19B illustrate circuit devices formed on a silicon substrate and light emitting device layers formed on a GaAs substrate, respectively. Reference numeral 11 denotes the GaAs substrate, reference numeral 12 denotes the light emitting device layers of GaAs, reference numeral 13 denotes the silicon substrate, and reference numeral 14 denotes the circuit device formed on the silicon substrate 13. The light emitting device can be acquired by transferring the light emitting device layers 12 onto the circuit device 14. The light emitting device layers 12 are placed on or close to a portion of the circuit device 14. The size of the light emitting layers 12 is about 10 mm*50 microns, for example. In contrast thereto, the size of the circuit device 14 is about 10 mm*0.3 mm, for example. Therefore, where light emitting device layers 12 are collectively transferred onto circuit devices 14, the arrangement and transferable number of the light emitting layers 12 are limited due to the arrangement of the circuit devices 14. Consequently, a usable area of the light emitting layers 12 per a unit area of the GaAs substrate 11 is liable to be small.

On the other hand, according to techniques of Japanese Patent Laid-open No. 2003-174041, a large number of chips are formed on the first substrate, and a portion of the chips is selectively transferred on the second substrate. Therefore, chips corresponding to transfer portions on a plurality of the second substrates can be formed on the first substrate. Thus, the first substrate can be efficiently used to a certain degree. According to such techniques, however, when the chip is selectively transferred, an adhesive is deposited on the chip for transfer. Therefore, there is a possibility that the following situations occur. When the chip size is small (for example, a width is less than several hundreds microns), the adhesive is likely to protrude from an intended chip. In such a case, an unintended chip is likely to be also bonded, and an unfavorable transfer can occur. As a result, the yield is likely to decrease.

Further, as the chip size decreases, the thickness of the adhesive is to be set thin so that the adhesive does not protrude from the intended chip. If a bonding process is performed under such condition, an unintended chip is likely to be brought into contact with the second substrate, and accordingly some damage may occur.

SUMMARY OF THE INVENTION

According to one aspect, the present invention provides a method that includes arranging a first bonding layer of a predetermined thickness on at least one of a first functional region and a second functional region bonded on a release layer, on a first substrate, and a region, to which the first functional region is to be transferred, on a second substrate; bonding the first functional region to the second substrate through the first bonding layer; irradiating the release layer with light with a light blocking member for blocking light toward a region on the first substrate, other than a region on which the first functional region exists, being provided to separate the first substrate from the first functional region at the release layer; arranging a second bonding layer of a predetermined thickness on at least one of the second functional region on the first substrate, and a region, to which the second functional region is to be transferred, on the second substrate or a region, to which the second functional region is to be transferred, on a third substrate; bonding the second functional region to the second substrate or the third substrate through the second bonding layer; and subjecting the release layer to irradiation with light or change in temperature to separate the first substrate from the second functional region at the release layer.

Further features of the present invention will become apparent from the following description of exemplary embodiments and examples, with reference to the attached drawings.

DETAILED DESCRIPTION OF THE EMBODIMENTS

Embodiments of the present invention will hereinafter be described with reference to the drawings. In this specification, the functional region typically means a region including a semiconductor junction. The region can be a device. Further, the functional region can be a region having piezoelectric properties, insulating properties, magnetic properties or the like, such as regions usable as functional devices having electric or magnetic function. At any rate, a critical point of the present invention is that the functional region is bonded to the substrate through the release layer including a material whose bonding strength lowers by the light irradiation, and the separation is performed at the release layer by the light irradiation of the release layer with the light blocking member being provided. On the basis of the above inventive concept, a fundamental transfer method of the present invention includes the first to sixth steps described above.

Figure 1A:
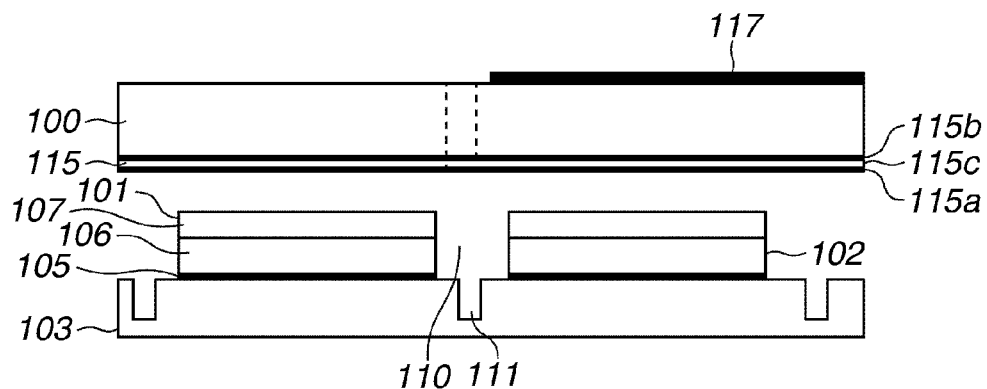
FIGS. 1A to 1C are cross-sectional views illustrating a step of preparing a first substrate in an embodiment of the transfer method according to the present invention.
Figure 1B:
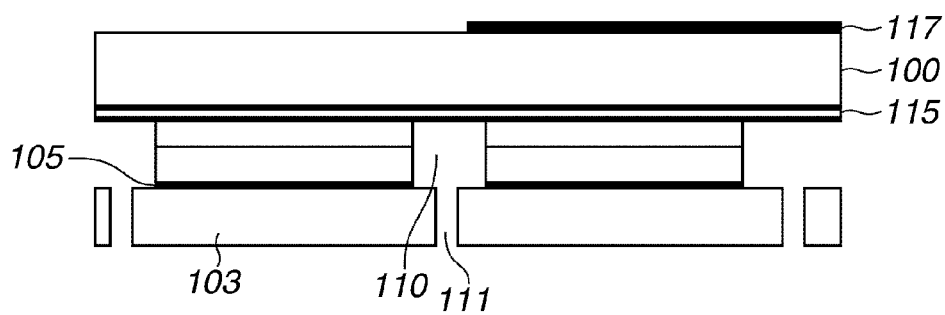
Figure 1C:
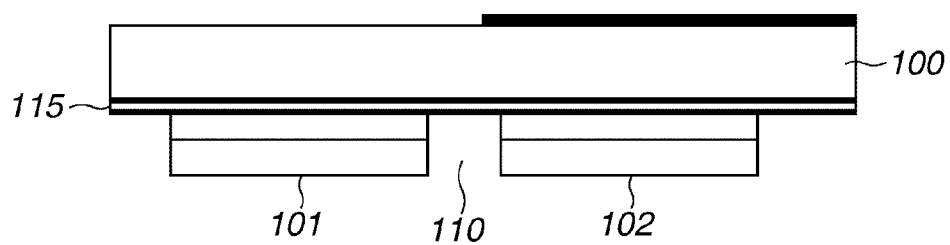

These steps will be described in detail. The first substrate is initially prepared in the first step. FIGS. 1A to 1C illustrate the step of preparing the first substrate 100 with functional regions. In this embodiment, as shown in FIGS. 1A to 1C, each of first and second functional regions 101 and 102 to be transferred from the compound semiconductor substrate 103 of a seed substrate to the first substrate 100 includes the compound semiconductor layer 106. Further, each of the first and second functional regions 101 and 102 includes the etching sacrificial layer 105 and the compound semiconductor layer 106 formed on the compound semiconductor substrate 103 in this order. Here, the resist layer 107 is formed and patterned on the compound semiconductor layer 106 on the substrate 103, and a portion between the first and second functional regions 101 and 102 is etched using the patterned resist layer 107 to form the first groove 110. Thus, island-like first and second functional regions 101 and 102 are separated from each other.

Further, the second groove 111 (this finally becomes a throughhole) is formed in at least one of the first substrate 100 and the compound semiconductor substrate 103. The second groove 111 is formed so as to be connected to the first groove 110. In this embodiment, the second groove 111 is formed in the compound semiconductor substrate 103 that is a GaAs substrate. The etching of GaAs is performed by an etchant of $NH_4OH+H_2O_2$ and/or Deep RIE (reactive ion etching). The first substrate 100 is a transparent substrate of glass or the like. The compound semiconductor layer 106 in the first and second functional regions 101 and 102 can include a distributed Bragg reflection (DBR) layer and an LED layer, and the etching sacrificial layer 105 can be an AlAs layer or the like.

As the seed substrate 103, a GaAs substrate, a p-type GaAs substrate, an n-type GaAs substrate, an InP substrate, a SiC substrate, a GaN substrate or the like can be used. Further, In place of the above compound semiconductor substrate, a sapphire substrate, a Ge substrate or the like can also be used. The etching sacrificial layer 105 is a layer that can be etched at an etching rate faster than the compound semiconductor laminated layer. As described above, the etching sacrificial layer 105 in this embodiment is an AlAs layer or AlGaAs layer (for example, $Al_{0.6}Ga_{0.4}As$). Where the AlGaAs layer is an $Al_xGa_{1-x}As$ layer (x is equal to or less than one (1), and equal to or more than 0.6), the etching selectivity is prominent when x is equal to or greater than 0.6. Where the etching sacrificial layer is the AlAs layer, an HF solution diluted to a range from two (2) percent to 10 percent can be used as the etchant.

Where the seed substrate 103 is a sapphire substrate, a metal nitride layer, such as a chrome nitride (CrN), can be used as the etching sacrificial layer. In this case, a functional laminated layer for producing a device (like LED or laser) for blue or ultraviolet radiation can be epitaxially grown on the chrome nitride. In the laminated layer, GaInN acting as an active layer and AlGaN or GaN acting as a spacer layer can be used. As the etchant for the sacrificial layer of chrome nitride (CrN) or the like, a normal Cr etchant (a chrome etching liquid or the like) can be used.

As shown in FIG. 1B, the compound semiconductor substrate 103 is lapped from the bottom surface so that the second groove 111 penetrates the substrate 103. Further, the first substrate 100 is bonded to the first and second functional regions 101 and 102 on the compound semiconductor substrate 103 by the release layer 115 including a material whose bonding strength lowers by the light irradiation. Here, although the second groove 111 is formed in the compound semiconductor substrate 103 in FIGS. 1A to 1C, the second groove can be readily formed rather in the substrate 100 since the GaAs substrate is very fragile and relatively weak in physical strength compared to the substrate 100 of glass or the like. The second groove in the substrate 100 is indicated by dotted lines in FIG. 1A.

In this embodiment, the release layer 115 includes the first release layer 115a and the second release layer 115b. The first release layer 115a is a UV releasable adhesive layer, whose decomposition or decrease in bonding strength occurs by UV light irradiation, attached on one surface of a sheet base material 115c. The second release layer 115b is a thermal releasable adhesive layer, whose decomposition or decrease in bonding strength occurs by a change in temperature, attached on the other surface of the sheet base material 115c. Further, the light blocking layer 117 is provided on a surface of the first substrate 100 corresponding to a region of the second functional region 102. The light blocking layer 117 can be formed by vacuum evaporation or the like. In place of the light blocking layer 117, a stencil mask capable of being readily placed and peeled can also be used. Further, in the following step described below, UV irradiation can be selectively performed to a desired area of the UV releasable adhesive layer by, for example, converging and scanning laser light at UV wavelength (300 nm to 400 nm). In this case, there is no need to use the light blocking layer.

Where the second groove is provided in the first substrate 100, the groove can be formed as follows. Where the first substrate is a silicon substrate, a penetrating groove of the second groove can be formed in an atmosphere of $SF_6$ or the like by the RIE using fluorine. The radical species is not limited to fluorine. In the case of wet etching, NaOH, KOH, TMAH or the like can be used. More specifically, after the release layer 115 is placed on one surface of the silicon substrate 100, a mask layer of a resist for forming the groove is formed on the other surface of the silicon substrate 100, and the groove is formed in the silicon substrate using the mask. While the dry etching like RIE or wet etching can be used, sand blast or the like can also be used. In the sand blast, fine particles of quartz or the like are blown on an exposed location to physically break a portion of the silicon substrate and form the groove. Such a penetrating groove can be formed in a thick silicon wafer of several hundreds microns, for example. In this formation of the penetrating groove, its side wall can be protected so that no degradation of its aspect ratio occurs. Further, this method is also readily applicable to the glass substrate or the like. Thus, instead of the above chemical etching, the formation of the penetrating groove can also be executed by the sand blasting method or a method of blowing fluid energy. Laser drill or micro drill can also be used to form the groove.

As described above, there can be prepared a substrate structure wherein the first groove 110 is formed in the compound semiconductor layer 106, and the second penetrating groove 111 connecting to the first groove 110 is formed in at least one of the substrate 100 and the seed substrate 103. FIG. 1B shows this substrate structure.

Then, an etchant is brought into contact with the etching sacrificial layer 105 through the first and second grooves 110 and 111 to etch the etching sacrificial layer 105. The compound semiconductor substrate 103 is thereby separated from the functional regions 101 and 102. The first substrate 100 with the first and second functional regions 101 and 102 is prepared as illustrated in FIG. 1C. The thus-separated compound semiconductor substrate 103 can be reused to newly form functional regions with compound semiconductor layers thereon. Where the first groove 110 or groove 111 is deep, there is a possibility that bubbles of gas (hydrogen) generated in etching the etching sacrificial layer of AlAs or the like may close an outlet port of the groove. In such a case, supersonic waves can be continuously or intermittently applied to the etchant or the compound semiconductor substrate. Further, alcohol or lubricant for decreasing the wetting angle can be added to the etchant (for example, hydrofluoric acid) to suppress or remove the bubbles during the etching process.

As described in the examples below, the method of preparing the first substrate with the functional regions placed provided thereon via the release layer is not limited to the above method. For example, the first substrate can be prepared by a method in which a fluid is blown to a side or its vicinity of an interface separation layer of the substrate structure to separate the substrate 103 therefrom.

Figure 2A:
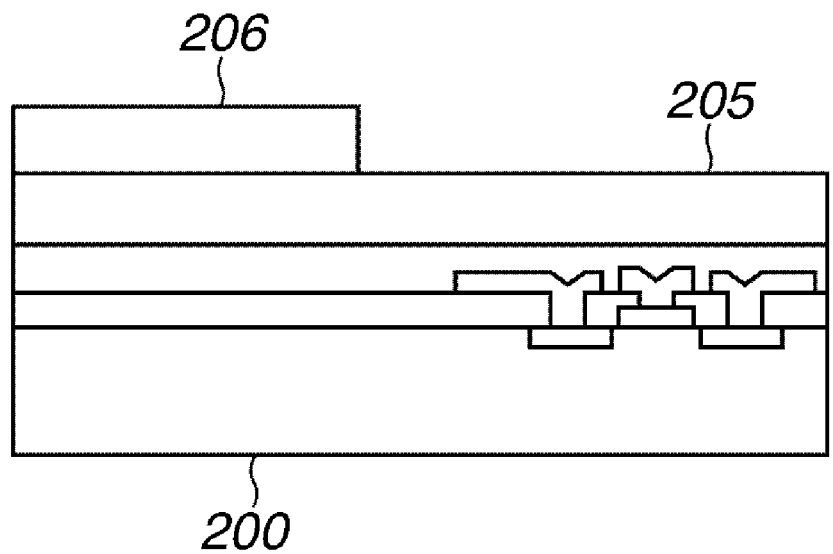
FIGS. 2A and 2B are cross-sectional views illustrating a step of forming a bonding layer in an embodiment of the transfer method according to the present invention.
Figure 2B:
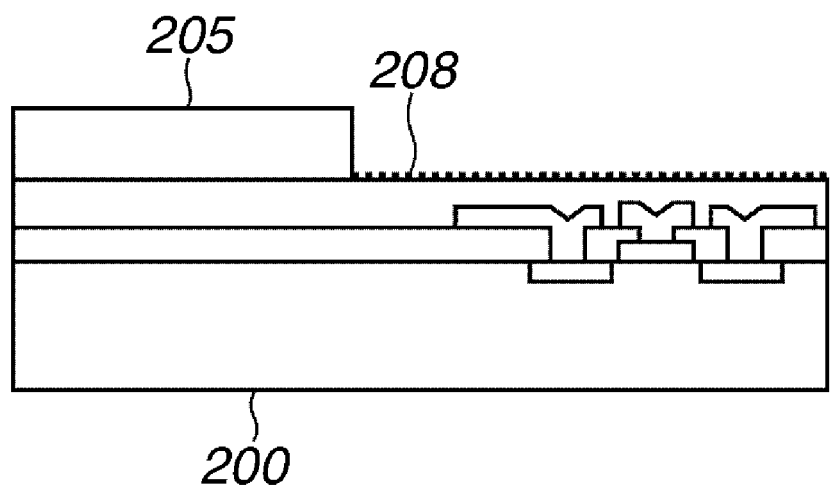

In a next step, the bonding layer 205 of a predetermined thickness is attached on at least one of the first functional region 101 to be selectively transferred and a region on a second substrate 200 to which the first functional region 101 is to be transferred. In this embodiment, as illustrated in FIGS. 2A and 2B, the bonding layer 205 is placed on the second substrate 200 of a silicon substrate with a driver circuit. Initially, as illustrated in FIG. 2A, the bonding layer 205 (for example, an organic insulating layer) is formed on the second substrate 200. Then, the masking with a resist 206 is performed only to a transfer expected region of the first functional region 101 on the second substrate 200. As illustrated in FIG. 2B, the etching is executed by chemical etching or RIE to form the bonding layer 205 only on the transfer expected region of the second substrate 200, and the resist 206 is removed by the asher or the like. Here, the thickness of the bonding layer 205 is about 2.0 microns, and its surface is sufficiently smoothed. With such a thickness, a strong pressure of the second functional region 102 against a surface of the second substrate 200 can be prevented when the first functional region 101 is bonded to the bonding layer 205.

In this embodiment, the thickness of the bonding layer 205 is approximately in a range from 1.0 micron to 10 microns. With a thickness below 1.0 micron, the bonding effect decreases. With a thickness above 10 microns, there is a possibility that the situation of wiring breakage at steps and the like arise when the functional region is electrically connected to the driver circuit and the like formed on the second substrate with the metal wiring after the functional region is transferred to the second substrate. Further, the transfer method of this embodiment can include a step of forming a predetermined unevenness 208 on a surface in a region of the second substrate 200, other than the region to which the first functional region 101 is to be transferred, as illustrated in FIG. 2B, according to necessity.

With such an unevenness 208, even if the second functional region 102 contacts with the surface of the second substrate 200 due to stress at the time of bonding, the bonding between the second functional region 102 and the substrate 200 can be effectively prevented. The unevenness 208 can be formed by over-etching performed when the bonding layer 205 is formed, for example. A surface of the unevenness 208 is sufficiently rough compared to the surface of the bonding layer 205. For example, smoothness $R_{pv}$ (the maximum of a peak-to-valley difference of unevenness) of the surface of the bonding layer 205 is below about 2 nm, and $R_a$ (the average of the peak-to-valley difference) is below about 0.2 nm. In contrast thereto, the surface roughness $R_{pv}$ of the unevenness 208 can be over about 2 nm, and $R_a$ of the unevenness 208 can be over about 0.2 nm.

As described above, plural island-like functional regions 101 and 102 are provided on the release layer 115 placed on the first substrate 100. In this example, the unevenness 208 is formed on the surface of the above region on the second substrate 200.

In this embodiment, the bonding layer 205 is formed of the organic material. As the organic material, polyimide and the like can be used. An epoxy-based bonding layer can also be used. In place of the above organic material layer, spin-on-polymer and organic spin-on-glass (SOG) can also be used. In these materials, methyl radical, ethyl radical, phenyl radical or the like is added to an inorganic insulating oxidized layer like a silicon oxide layer, and the plasticity is thereby increased. For example, where the circuit region is formed on and/or in a silicon substrate of the second substrate 200, the following treatment can be performed. Using the organic SOG, the silicon oxide insulating layer for increasing flatness on the circuit region is formed on the second substrate 200 to a predetermined thickness, and is patterned. The silicon oxide insulating layer has a given stickiness at about the pre-bake temperature of 100 degrees centigrade.

In this example, such stickiness of the surface of the bonding layer 205 after the pre-bake process helps the bonding in the following bonding step. Generally, tackiness (stickiness) is considered to appear owing to silanol group of hydrolysis radical, alkoxy group of organic component or the like contained in the organic insulating material (for example, spin-on-polymer). These constituents can cause junction or bonding strength between wafers or devices as dehydration-condensation reaction proceeds at process temperatures. With respect to the plasticity, non-hydrolysis radical out of the organic constituents contributes to stability of the plasticity of material at high temperatures (>400 degrees centigrade). Critical factors of the bonding are considered to be surface flatness and particles. In connection therewith, the flatness used to an underlayer with device structures and the bonding surface can be relaxed by the presence of the organic insulating layer having the plasticity and tackiness.

Further, with respect to the influence of particles, particles of some sizes can be buried in the organic insulating layer due to its plasticity. Accordingly, the influence of particles can be substantially eliminated. The plasticity also serves to greatly relax the strain stored when the thickness of the layer is increased. When the amount of organic constituent for increasing the plasticity is small and a relatively thick layer (over one (1) micron) is formed, defects like cracks are likely to appear. For these reasons, when the amount of organic constituent in hydrolysis and non-hydrolysis radicals contained in the organic SOG is set to be above about 1 (one) wt. percent, appropriate stickiness and plasticity can be obtained. Accordingly, even a layer having a thickness in the micron order can be a stable layer.

As described above, the second substrate 200 is, for example, a semiconductor substrate, a silicon substrate, a silicon wafer with an oxidized layer on its surface, a silicon wafer provided with an electric circuit (for example, a driver circuit), or the like. Where an LED is fabricated including a compound semiconductor laminated layer, the driver circuit is, for example, a circuit for drive-controlling the LED. The silicon substrate can be a substrate with an epitaxial silicon layer on its surface as well as a so-called CZ wafer. In place of the silicon substrate, a silicon-on-insulator (SOI) substrate can also be used.

Figure 3A:
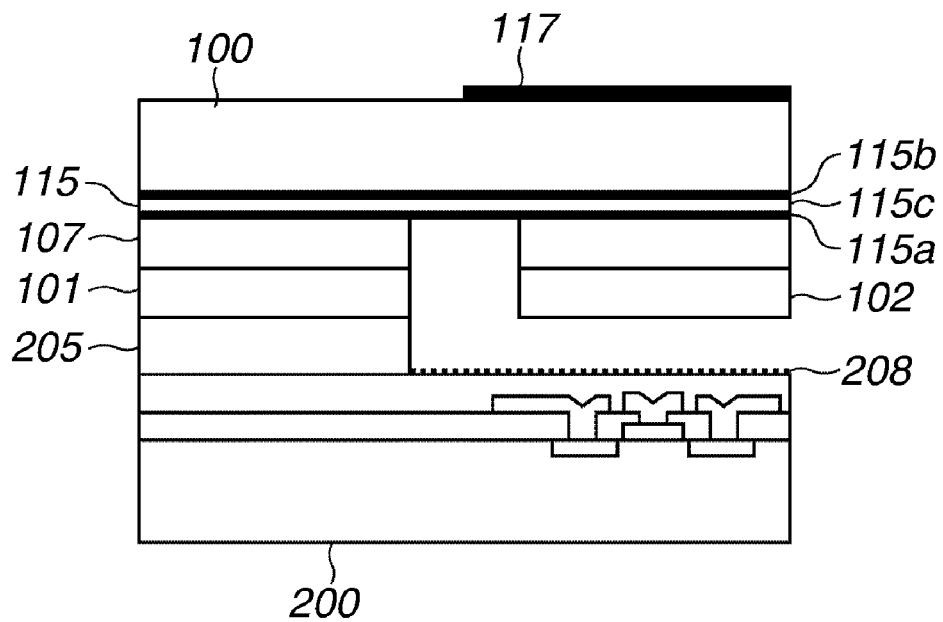
FIGS. 3A and 3B are cross-sectional views illustrating a step of selectively transferring a first functional region on a first substrate to a second substrate in an embodiment of the transfer method according to the present invention.
Figure 3B:
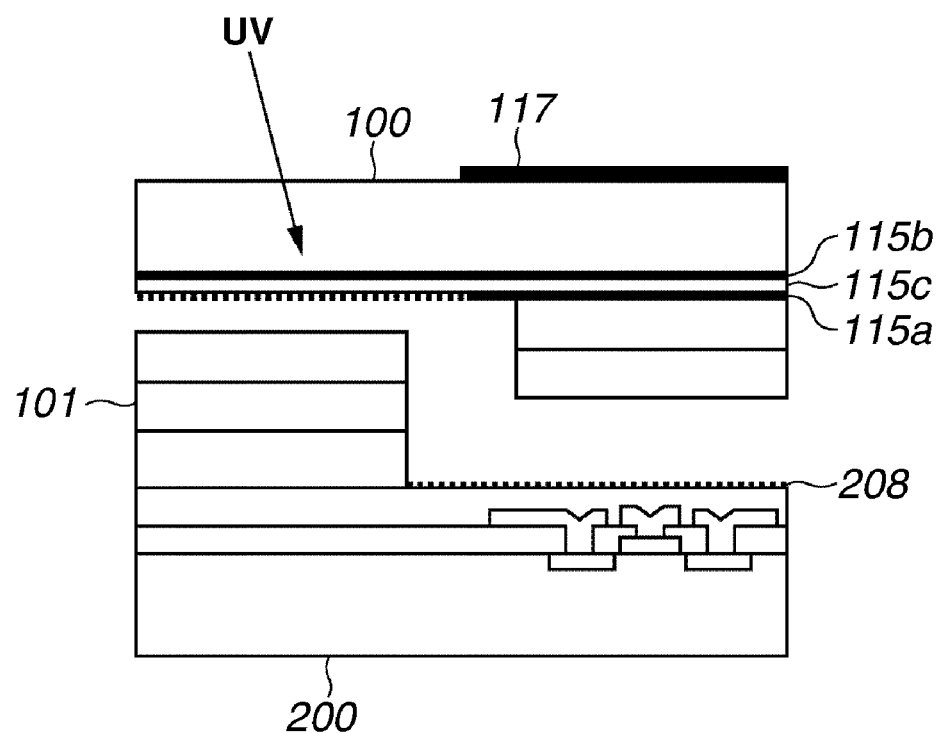

Description will be made of the second step in which the first functional region 101 is bonded to the second substrate 200 by the first bonding layer 205, and the third step in which the first substrate 100 is separated from the first functional region 101 at the release layer 115 by the light irradiation of the release layer with a light blocking member 117 for blocking light toward the region on the first substrate, other than the region to which the first functional region is transferred, being provided. As illustrated in FIG. 3A, the first functional region 101 on the release layer 115 placed on the first substrate 100 is aligned with and bonded to the bonding layer 205. As illustrated in FIG. 3B, in the third step, the first substrate 100 is separated from the first functional region 101 at the releasable adhesive layer 115a of the release layer 115. In this embodiment, the releasable adhesive layer 115a is subjected to a given process and becomes releasable. The given process is a process for causing decomposition or decrease in bonding strength of the releasable adhesive layer. Here, irradiation of UV light is performed from a side of the transparent substrate 100 to cause decomposition or decrease in bonding strength of the UV releasable adhesive layer 115a. Thus, the first substrate 100 is separated from the first functional region 101. Due to the presence of the light blocking member 117, no UV irradiation is executed to a portion of the releasable adhesive layer 115a corresponding to the second functional region 102. Therefore, this portion of the releasable adhesive layer 115a remains unchanged, and as illustrated in FIG. 3B, the second functional region 102 remains on the first substrate 100. In the third step, UV laser light can be condensed to a fine spot, and scanned.

Figure 9:
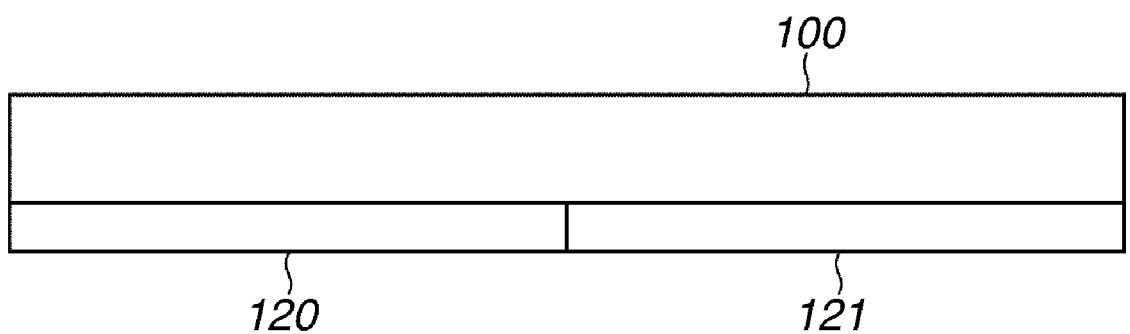
FIG. 9 is a cross-sectional view illustrating a combination of patterned release layers on a surface of a first substrate.

The release portion 115 can have another configuration. For example, as illustrated in FIG. 9, release layers 120 and 121 with different properties can be attached on the first substrate 100, corresponding to the first and second functional regions 101 and 102, respectively. For example, one is a first radiation releasable adhesive layer, and the other is a second radiation releasable adhesive layer whose decomposition or decrease in bonding strength occurs by irradiation of light at a wavelength different from that of the first radiation releasable adhesive layer. Also in such a case, the light blocking member can be arranged on the first substrate 100 so that when one radiation releasable adhesive layer is irradiated with light, the light irradiation of the other adhesive layer can be surely prevented.

The release layer or portion 115 with the first and second releasable adhesive layers can be formed on the first substrate 100 by vacuum evaporation or the like, instead of using a sheet. More specifically, the release layer can be formed of a material containing thermal foaming capsules. The UV releasable adhesive material can be a material whose cross-link breaks due to UV energy irradiation, or a material containing capsules capable of being foamed by absorption of UV light. The thermal releasable adhesive material can be REVALPHA (product name by NITTO DENKO), or the like.

Description will be made of the fourth to sixth steps. In the fourth step, the second bonding layer 305 is arranged on at least one of the second functional region 102 remaining on the first substrate 100, and a region, to which the second functional region is to be transferred, on the third substrate 300 (this can be the second substrate 200). In the fifth step, the second functional region 102 is bonded to the third substrate 300 through the second bonding layer 305. In the sixth step, the release layer is subjected to light irradiation or change in temperature to separate the first substrate 100 from the second functional region 102 at the release layer.

Figure 4A:
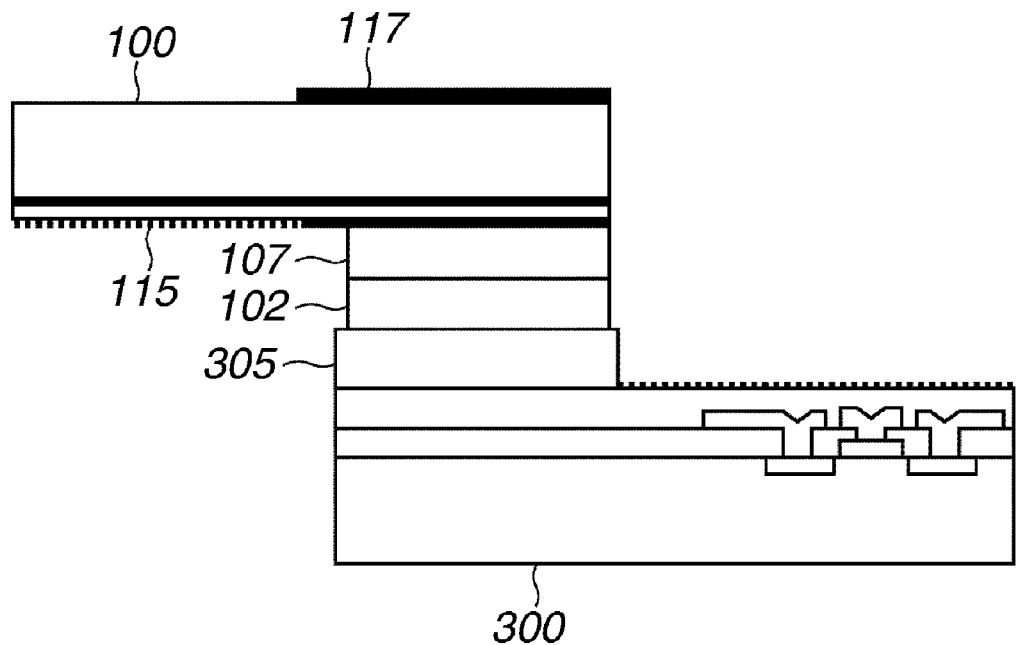
FIGS. 4A and 4B are cross-sectional views illustrating a step of selectively transferring a second functional region on a first substrate to a third substrate in an embodiment of the transfer method according to the present invention.

When the second functional region 102 is transferred to the third substrate 300, substantially the same process as that for transfer of the first functional region 101 can be performed. In other words, as illustrated in FIG. 4A, the second bonding layer 305 (for example, the organic insulating layer) is formed on the third substrate 300, and the masking with a resist layer is executed only to a transfer expected region of the second functional region 102 on the third substrate 300. Thereafter, the etching is executed by chemical etching or RIE to form the bonding layer 305 on the desired region.

Figure 4B:
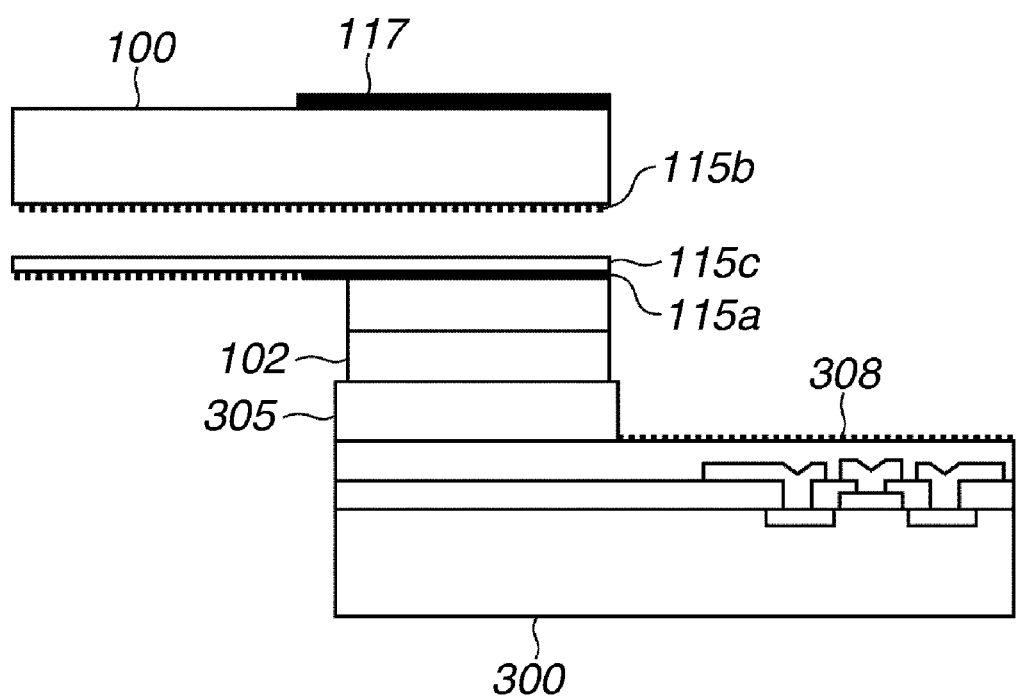

Next, as illustrated in FIG. 4A, the second functional region 102 is aligned with and bonded to the second bonding layer 305. As illustrated in FIG. 4B, the first substrate 100 is separated from the second functional region 102 at the releasable adhesive layer 115b. Here, the thermal releasable adhesive layer 115b of the release layer 115 is subjected to heating to about 170 degrees centigrade to cause decomposition or decrease in bonding strength of the thermal releasable adhesive layer 115b. Thereafter, the resist 107 is removed by the lift-off.

In this embodiment, it is also possible to omit the light blocking layer 117, and perform entire light irradiation so that the first substrate 100 can be separated from the first functional region 101 at the releasable adhesive layer 115a. In this case, the release layer 115 can include only the releasable adhesive layer 115a. Or, the releasable adhesive layer 115b can also be formed of a material whose decomposition or decrease in bonding strength occurs when irradiated with light.

As described above, when the second functional region 102 is transferred to the third substrate, the second bonding layer of a predetermined thickness is formed on at least one of the second functional region remaining on the first substrate and the region on the third substrate to which the second functional region is to be transferred. Then, the step of bonding the second functional region 102 and the third substrate 300 with the second bonding layer 305, and the step of separating the first substrate 100 from the second functional region 102 at the release layer are performed. Also in this case, it is possible to form a predetermined unevenness 308 on the region on the third substrate 300, other than the region to which the second functional region is to be transferred (the seventh step).

As described above, the first releasable adhesive layer 115a and the second releasable adhesive layer 115b can include respective materials whose decompositions or decreases in bonding strength occur when subjected to the light irradiation and the heating to a given temperature. In this case, the third step includes the step of irradiating the first releasable adhesive layer with light for a predetermined time, and the sixth step includes the step of maintaining the second releasable adhesive layer at the temperature above a given temperature for a predetermined time.

Figure 5A:
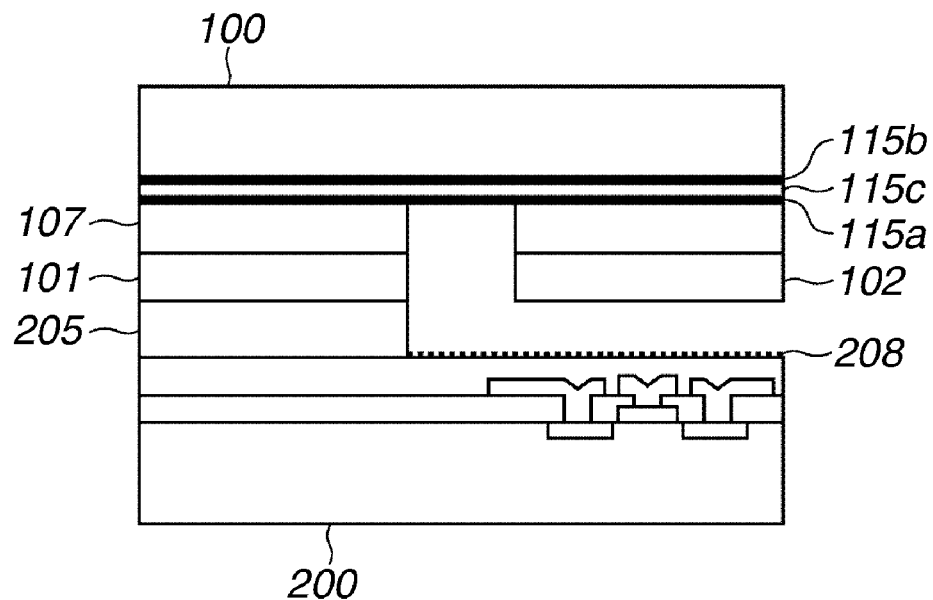
FIGS. 5A and 5B are cross-sectional views illustrating a step of selectively transferring a first functional region on a first substrate to a second substrate in another embodiment of the transfer method according to the present invention.
Figure 5B:
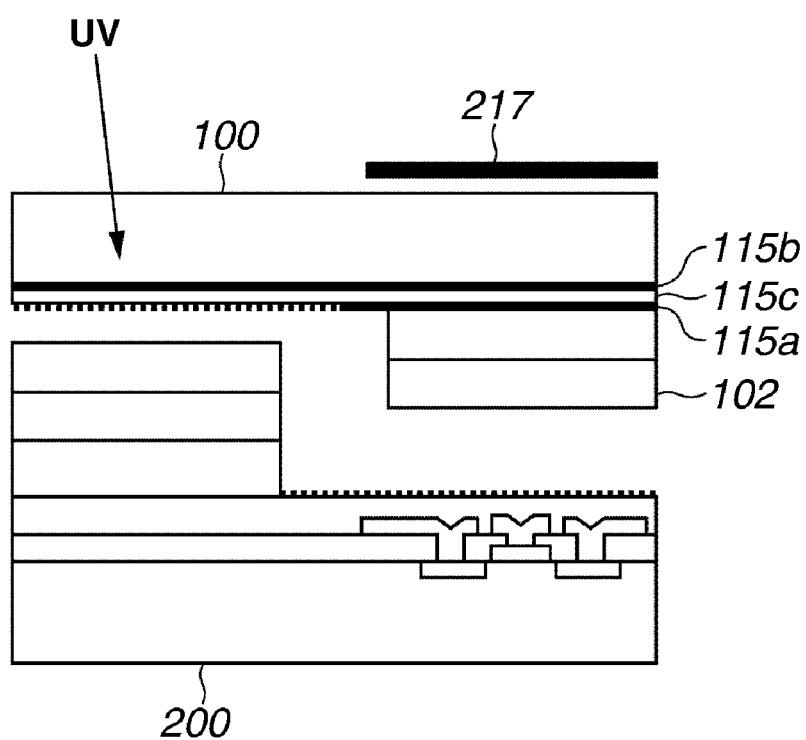
Figure 6A:
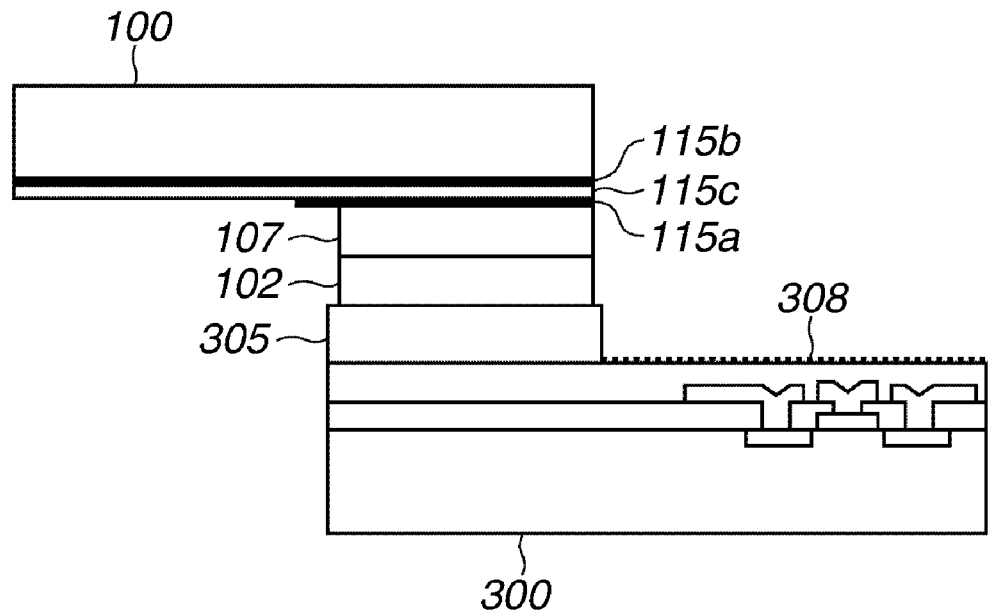
FIGS. 6A and 6B are cross-sectional views illustrating a step of selectively transferring a second functional region on a first substrate to a third substrate in another embodiment of the transfer method according to the present invention.
Figure 6B:
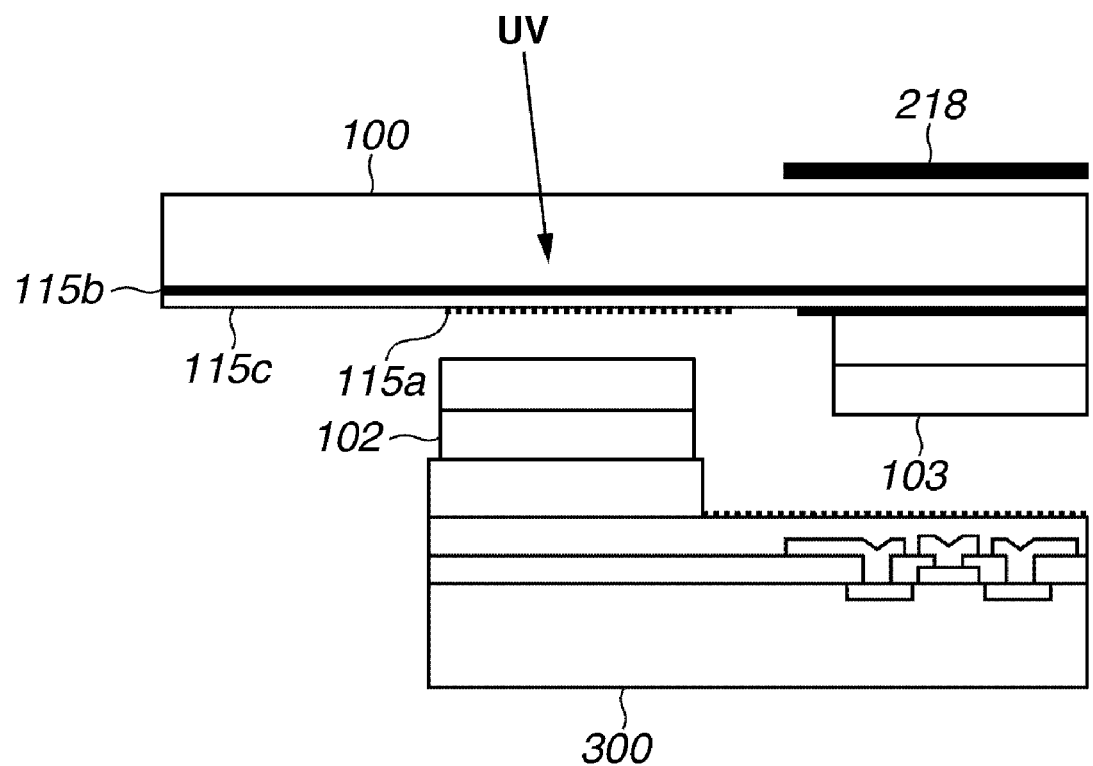
Figure 7A:
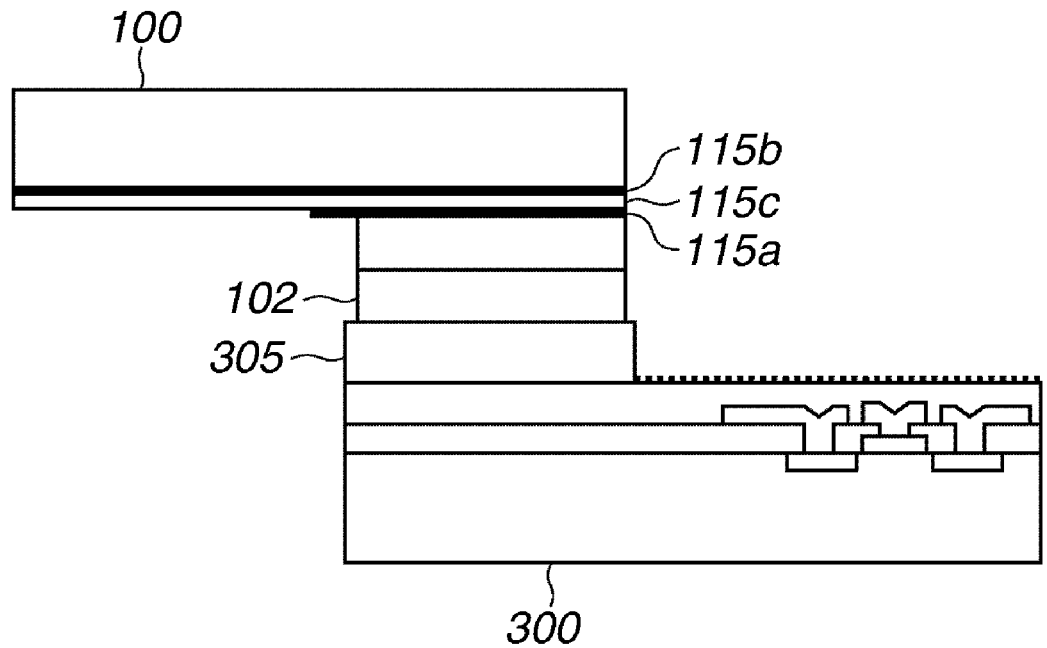
FIGS. 7A and 7B are cross-sectional views illustrating a step of selectively transferring a second functional region on a first substrate to a third substrate in still another embodiment of the transfer method according to the present invention.
Figure 7B:
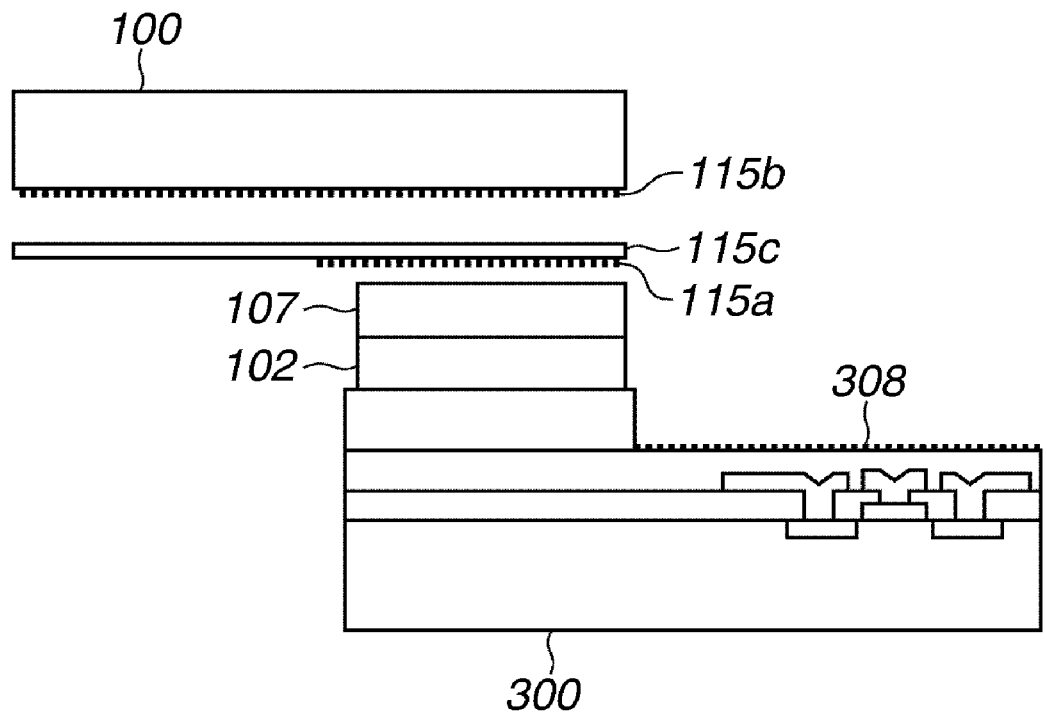

The transfer method using the light blocking stencil mask 217 will be described. In this method, the releasable adhesive layer 115a can include a material whose decomposition or decrease in bonding strength occurs when subjected to the light irradiation. The releasable adhesive layer 115b can include a material whose decomposition or decrease in bonding strength occurs when subjected to the light irradiation or heating to a given temperature. Here, as illustrated in FIG. 5B, in the third step, the light irradiation is performed for a predetermined time with the stencil mask 217 being provided on a given surface of the first substrate 100. Thereby, the first functional region 101 bonded to the second substrate 200 with the bonding layer 205 can be separated from the first transparent substrate 100. Then, as illustrated in FIG. 6B, in the sixth step, the light irradiation is performed for a predetermined time with another stencil mask 218 being provided on a given surface (a surface in a portion corresponding to a third functional region 103 not to be transferred from the first substrate 100). Thereby, the second functional region 102 bonded to the third substrate 300 with the bonding layer 305 can be separated from the first substrate 100.

Where the second releasable adhesive layer 115b includes a material whose decomposition or bonding strength occurs when subjected to a given temperature and no functional region exists anymore on the first substrate 100, steps illustrated in FIGS. 7A and 7B can be performed. In other words, in the sixth step, with the light blocking member being removed, the release layer 115 is maintained at temperature above a given temperature for a predetermined time to separate the first substrate 100 from the second functional region 102 bonded to the third substrate 300 by the bonding layer 305. In the sixth step, it is also possible to perform entire irradiation to separate the first substrate 100 from the second functional region 102 bonded to the third substrate 300 by the bonding layer 305 at the releasable adhesive layer 115a. Thereafter, the resist 107 is removed by the lift-off.

Figure 8A:
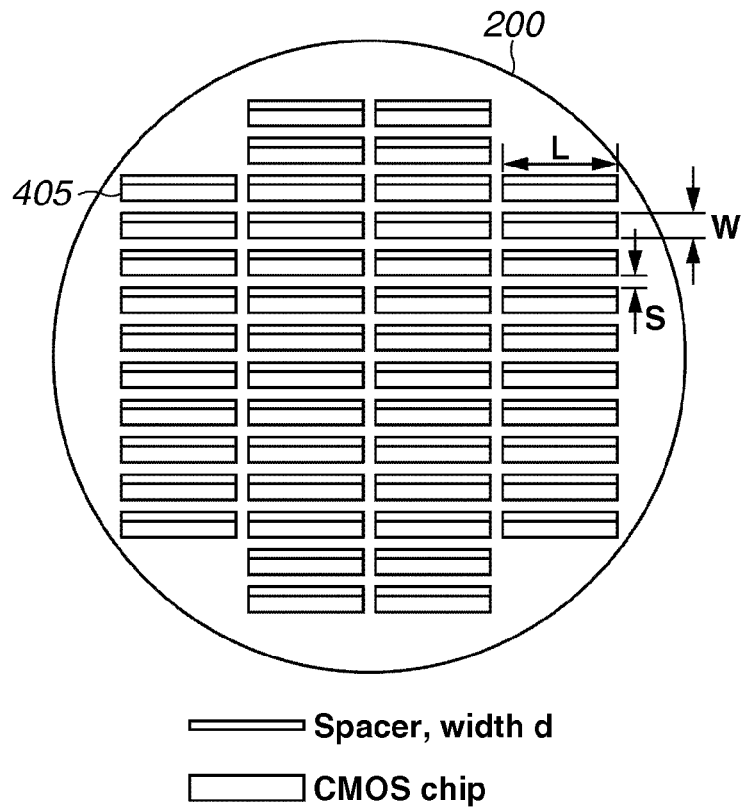
FIG. 8A is a plan view illustrating plural transfer expected regions on a second substrate.
Figure 8B:
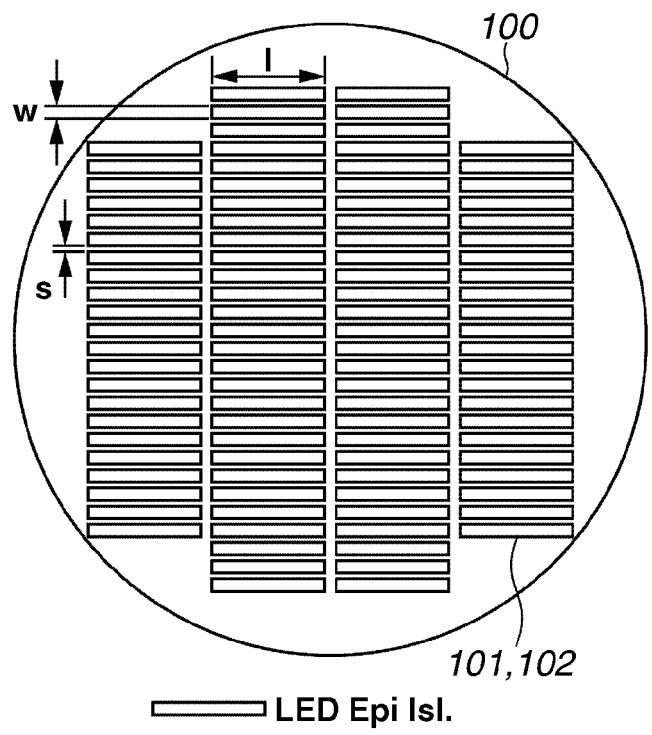
FIG. 8B is a plan view illustrating plural functional regions on a first substrate.

First and second functional regions 101 and 102 can be arranged on the first substrate 100 in any desired island-like pattern. Typically, the island-like first and second functional regions 101 and 102 are arranged on the substrate 100 at a predetermined inter-distance as illustrated in FIG. 8B. In this case, regions 405 to be bonded or connected to the first functional regions 101 are arranged on the second substrate 200 at a predetermined inter-distance as illustrated in FIG. 8A, for example.

The region 405 is a region including a spacer for the bonding layer 205 and a CMOS chip area. In such a configuration, when only the first functional region 101 on the first substrate 100 is transferred to the spacer for the bonding layer 205 on the second substrate 200, the transfer can be efficiently achieved if the following relations 1 to 3 are satisfied.

$$l < or = L \quad \text{(relation 1)}$$

$$W > w \quad \text{(relation 2)}$$

$$W + S > w + s \quad \text{(relation 3)}$$

As illustrated in FIGS. 8A and 8B, w is the width of each of the first and second functional regions on the first substrate, l is the length of each functional region, s is the distance between the functional regions, W is the width of a region to be connected to the first functional region transferred to the second substrate, L is the length of the region on the second substrate, and S is the distance between the regions on the second substrate.

Further, satisfaction of the following relations 4 to 6 is also favorable.

$$l=L \quad \text{(relation 4)}$$

$$W=n*w \quad \text{(relation 5)}$$

$$W+S=n(w+s) \quad \text{(relations 6)}$$

where n is an integer equal to or more than 2. Here, the first functional regions 101 densely formed on the first substrate 100 can be selectively transferred to the region of the bonding layer 205 on the second substrate 200 repetitively, for example, n times. In such a case, when the functional region of a light emitting layer or the like is transferred to the circuit device or the like, the arrangement and adoptable number of the functional regions are not so limited by the arrangement of the circuit devices. Accordingly, a ratio of an area of the seed substrate usable for the formation of light emitting layers or the like can be increased. It is thus possible to efficiently use the compound semiconductor wafer that is expensive compared to the silicon wafer. Advantageous economical effects can be obtained in fabricating complex multi-functional-device integrated circuits and the like. Here, the second silicon substrate 200 illustrated in FIG. 8A includes the third functional region 405 with the CMOS chip, and the first functional region 101 is bonded or connected to the third functional region through the bonding layer 205. Similarly, the third substrate includes a fourth functional region, and the second functional region 102 is bonded to the fourth functional region through the bonding layer.

Further, on the seed substrate 103 illustrated in FIG. 1A, etching sacrificial layers and compound semiconductor laminated layers can be alternately formed repetitively. In such a case, the transfer of the compound semiconductor laminated layer to the first substrate can be repetitively executed. Etching stop layers, etching sacrificial layers, and compound semiconductor laminated layers can also be alternately formed repetitively. In this case, the number of thermal hysteresis times for epitaxial growth on the seed substrate is not plural.

Further, it is possible to entirely transfer the functional regions transferred to the second or third substrate to a final fourth substrate. In this case, the second or third substrate is a temporary carrier substrate similarly to the first substrate, but not a final transfer substrate. In such a transfer method, the following steps are performed. In the second step, the first functional region is bonded to the second substrate through the bonding layer of a second release layer that becomes releasable when subjected to a given process. For example, the bonding layer 205 of the organic insulating layer in FIG. 3A is replaced with a release layer like the release layer 115 in FIG. 1A. Then, the eighth to tenth steps are performed. In the eighth step, a bonding layer of a predetermined thickness is placed on at least one of a fourth substrate and the first functional region bonded to the second substrate with the second release layer. Formation of the bonding layer is approximately similar to that of the above bonding layer. No patterning is performed. In the ninth step, all the functional regions on the second substrate are bonded to the fourth substrate by the bonding layer. In the tenth step, the second substrate is separated from the functional regions at the second release layer. The second release layer used may or may not be selectively releasable, so that the second release layer can be made simpler in structure than the above release layer.

Further, the temporary second substrate can be formed of a material similar to that of the above first substrate, and the light blocking layer may be omitted.

In this method, plural functional regions on the temporary first substrate 100 are selectively transferred to plural temporary second substrates, respectively. Thereafter, all the functional regions on each second substrate are entirely transferred to each final substrate. Although this method seems a roundabout way since the number of temporary substrates increases, it can make a working flow smooth and the transfer can be efficiently advanced in some situations.

Description will be made to examples directed to the transfer method, LED array, LED printer head, and LED printer.

Figure 10:
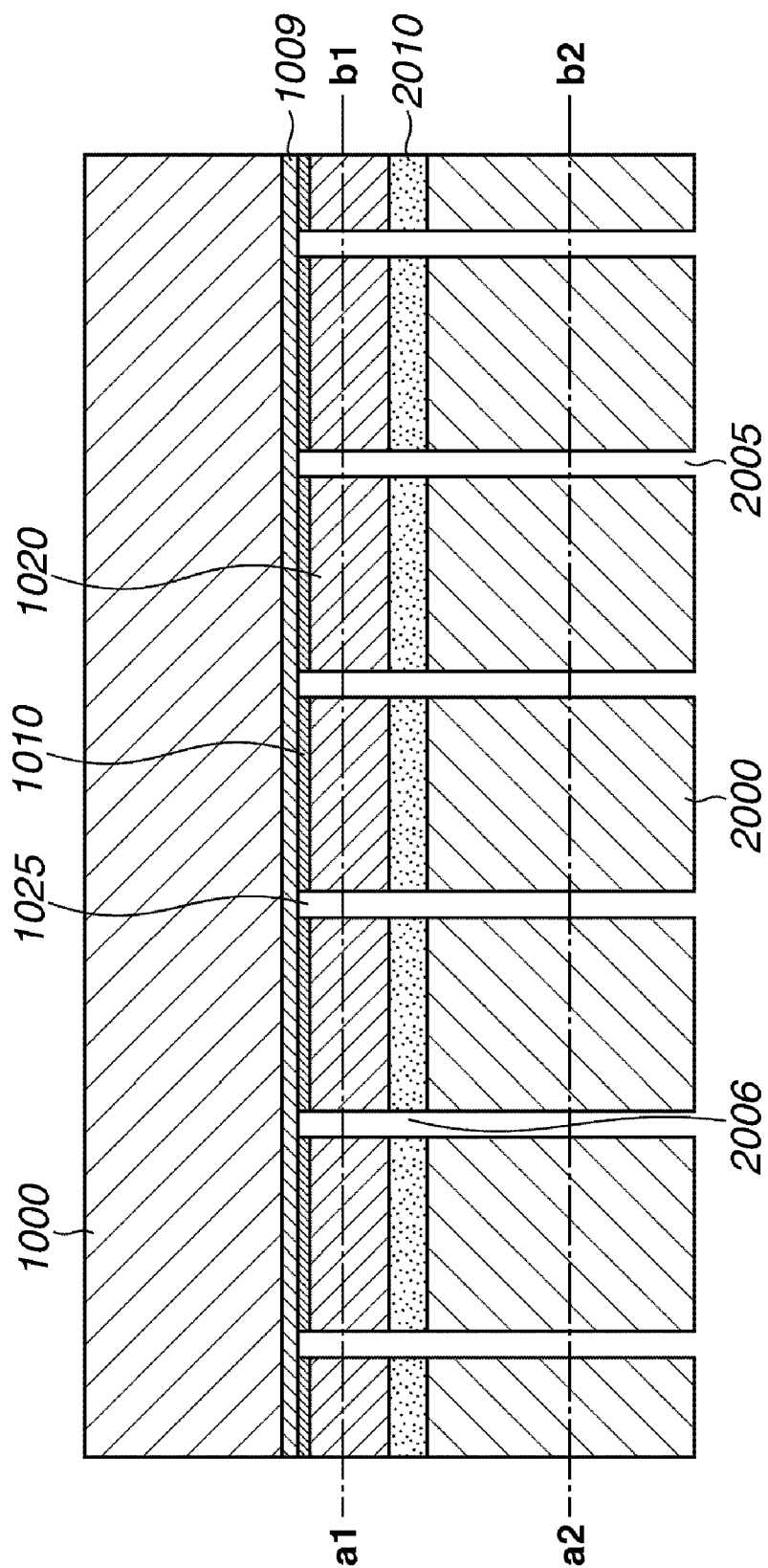
FIG. 10 is a cross-sectional view illustrating a step of preparing a first substrate in a first example of the transfer method according to the present invention.

First example including the step of preparing the first substrate with functional regions will be described with reference to FIG. 10 to FIG. 13. In FIG. 10, reference numeral 1000 denotes a substrate (for example, a compound semiconductor substrate, or a substrate of Ge or the like). Reference numeral 1009 denotes an etching stop layer, reference numeral 1010 denotes an etching sacrificial layer, and reference numeral 1020 denotes a compound semiconductor laminated layer. Reference numeral 1025 denotes a first groove for dividing the compound semiconductor laminated layer 1020 on the compound semiconductor substrate 1000 into island-like regions. The etching stop layer 1009 can be provided according to necessity.

Further, reference numeral 2000 denotes a first substrate (for example, a silicon substrate), reference numeral 2005 denotes a second groove formed in the first substrate 2000, and reference numeral 2010 denotes a release layer. A third groove 2006 is formed in the release layer 2010. The third groove 2006 connects to the second groove 2005. In this example, although the width and inter-distance of the first groove 1025 illustrated in FIG. 10 are equal to those of the second groove 2005, the width of the first groove 1025 can be made larger than that of the second groove 2005. Since the first groove 1025 should be connected to the groove 2005, the width of the compound semiconductor layer can be made narrower than the distance between the grooves 2005 penetrating the silicon substrate 2000. The first substrate 2000 is not limited to the silicon substrate. It can be a glass substrate or the like, as described above.

In FIG. 10, the width of the first groove 1025 is from several microns to several hundreds microns, for example. Further, the width of the second groove 2005 is from several microns to several hundreds microns, for example. The second penetrating groove 2005 can be above 50 microns, or above 100 microns, or above 200 microns so that an etchant can be readily introduced. However, it depends on the thickness of the first substrate 2000. It is important to determine the position of the penetrating groove 2005 so that a device region is not reduced as far as possible. Therefore, the position of the penetrating groove 2005 can be aligned with a scribe line having a chip separation width. There are many cases where the wire bonding pad on a silicon circuit (see FIG. 16) occupies an area larger than a device of the silicon circuit. In this case, the pad region cannot become a region to which the device is transferred. Therefore, when pad regions are concentrated to an end portion of the silicon circuit chip, regions of the first substrate corresponding to the concentrated pad regions can be used for the formation of the penetrating grooves.

Figure 11:
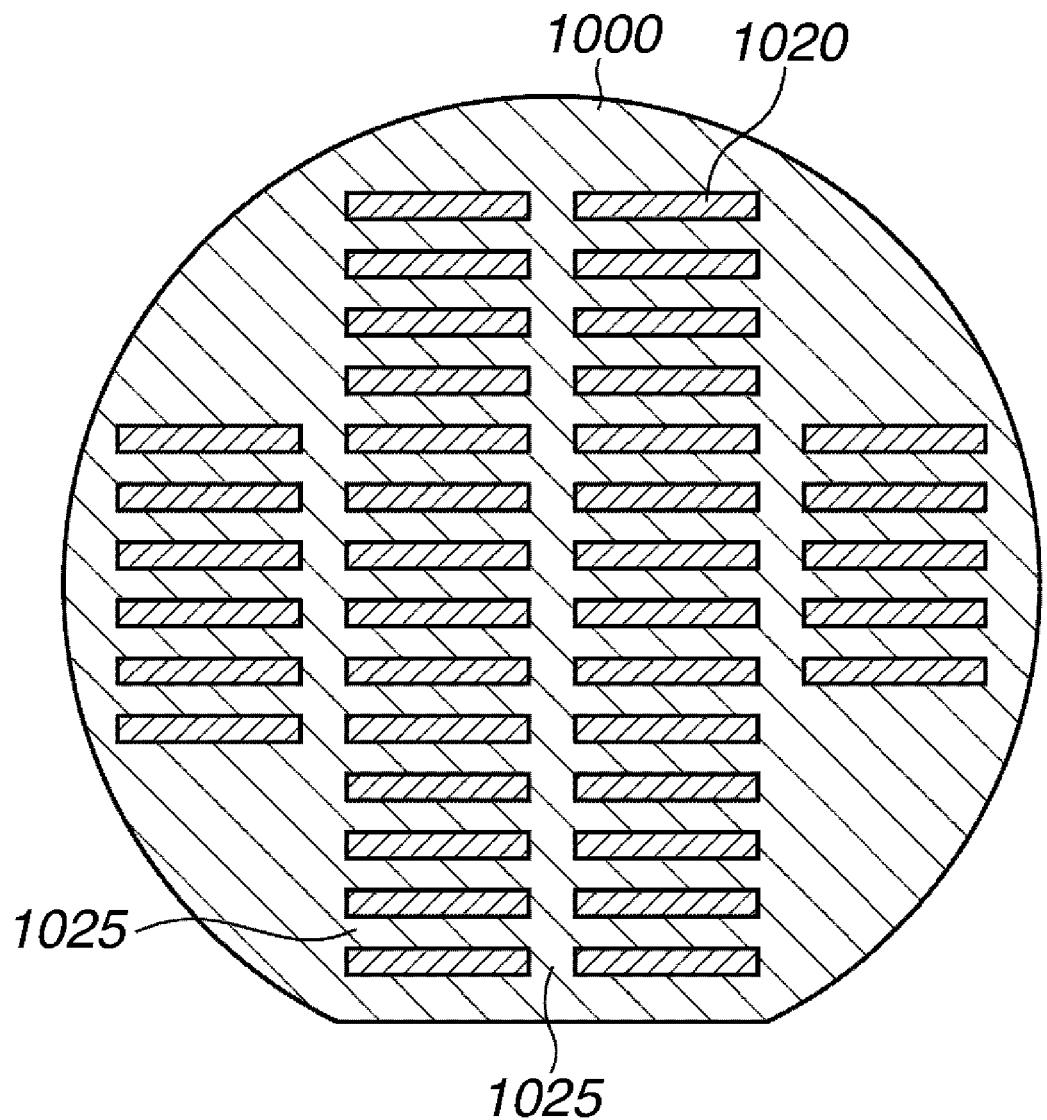
FIG. 11 is a plan view obtained by viewing an a1-b1 cross section of FIG. 10 from one side.
Figure 12:
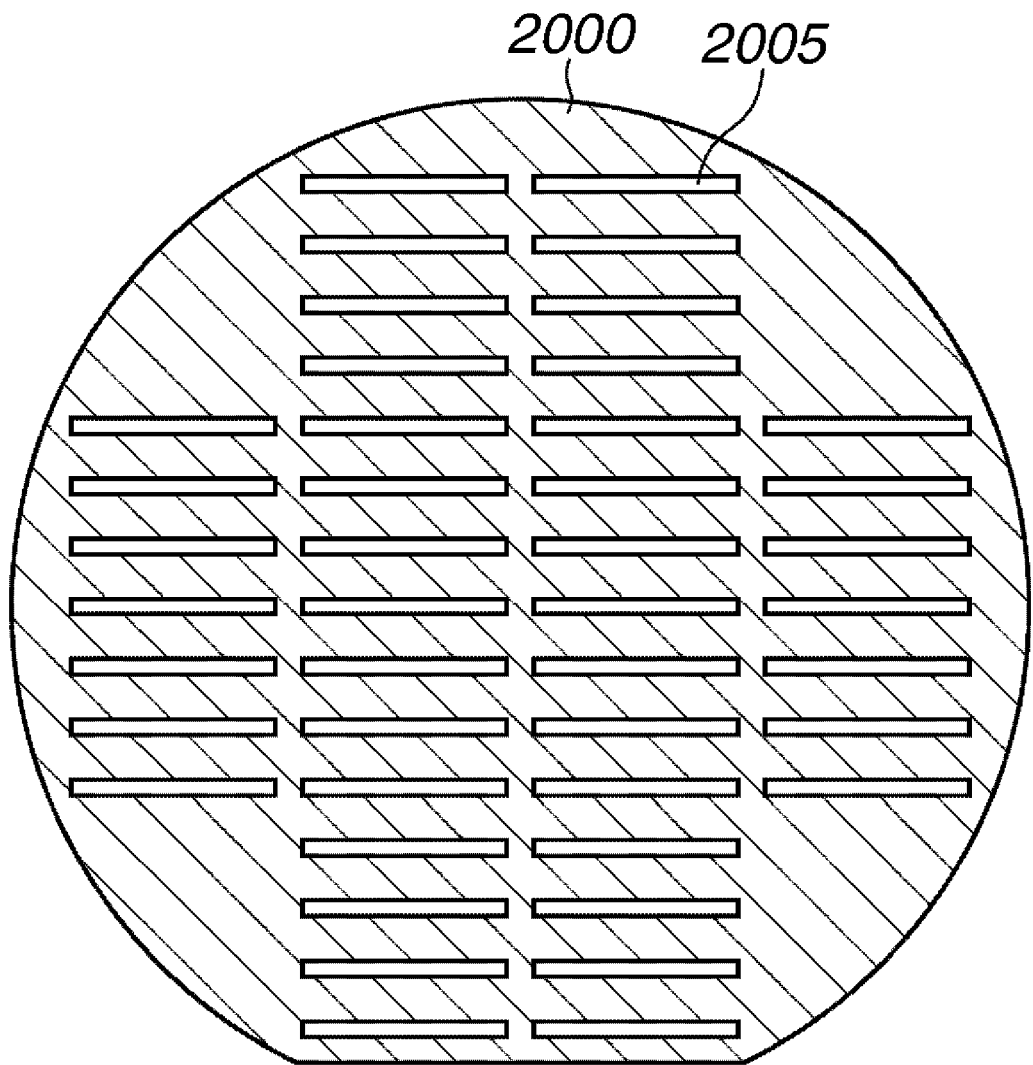
FIG. 12 is a plan view obtained by viewing an a2-b2 cross section of FIG. 10 from one side.
Figure 13:
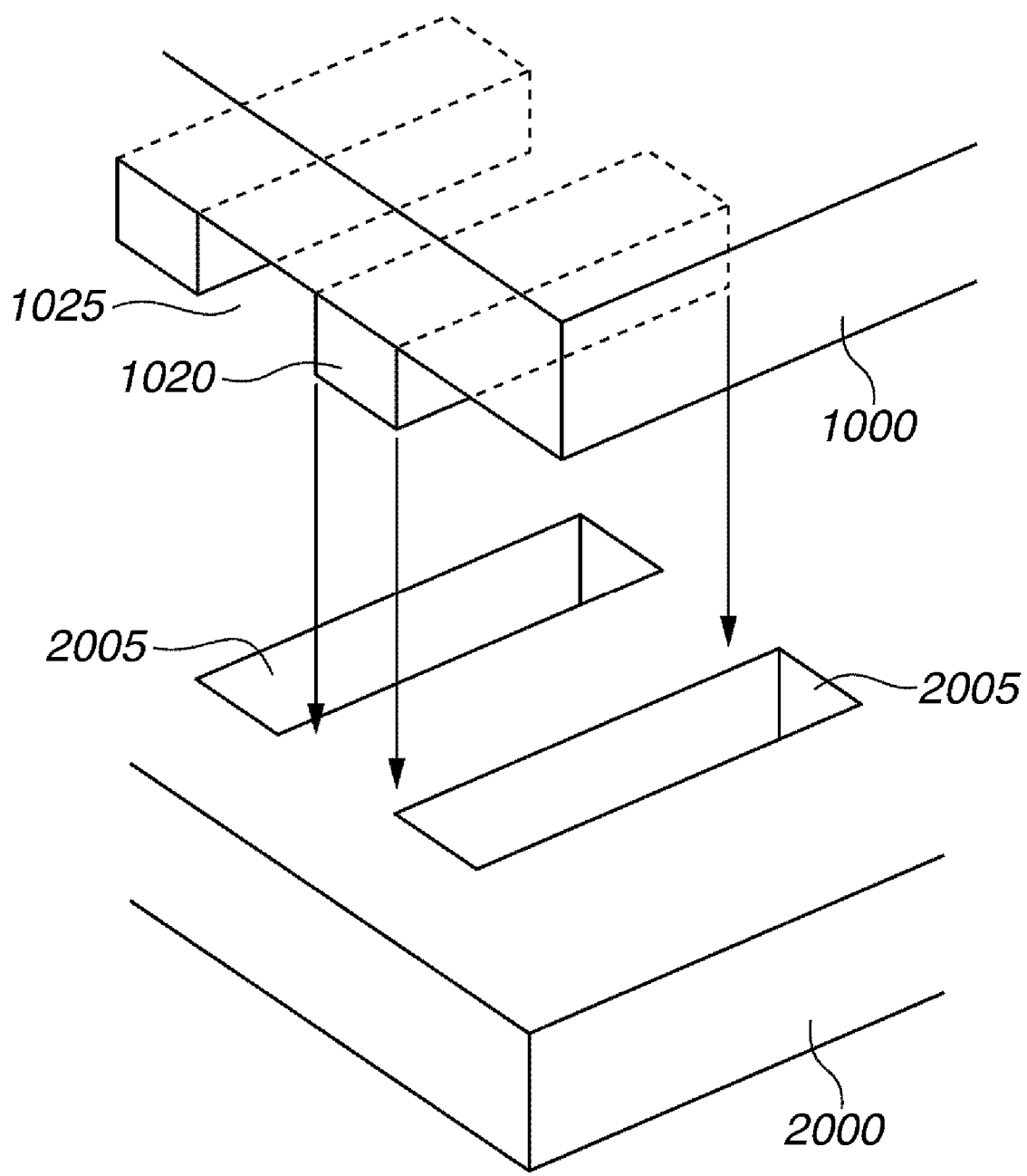
FIG. 13 is a disassembled perspective view illustrating the positional relationship between a first groove and a groove in a semiconductor substrate, and a manner in which an island-like compound semiconductor laminated layer is arranged between grooves in the semiconductor substrate.

FIG. 11 shows a cross section taken along a line a1-b1 in FIG. 10. As is apparent from FIG. 11, the compound semiconductor laminated layer 1020 is divided into island regions on the compound semiconductor substrate 1000. The island region protrudes from its surrounding region. The compound semiconductor laminated layer 1020 is to be divided in a desired pattern, and hence its divided shape may or may not be a rectangular one as illustrated in FIG. 11. The first groove 1025 is a space between the island regions of the compound semiconductor laminated layer 1020. In FIGS. 11 to 13, like elements in FIG. 10 are denoted by like reference numerals in FIG. 10.

FIG. 12 shows a cross section taken along a line a2-b2 in FIG. 10. As illustrated in FIG. 12, the groove 2005 is formed in the silicon substrate 2000. The semiconductor substrate grooves 2005 are formed at some appropriate inter-distances therebetween. Due to such arrangement of the penetrating grooves, for example, rigidity of the silicon wafer is not so degraded. Accordingly, handling is facilitated in the following processes. FIG. 13 shows the positional relationship between the first groove 1025 and the groove 2005 in the semiconductor substrate, and a manner in which the island region of the compound semiconductor laminated layer 1020 is arranged in a portion between the grooves 2005 in the semiconductor substrate 2000. In FIG. 13, release layer 2010, etching stop layer 1009, and etching sacrificial layer 1010 are omitted. As illustrated in FIG. 13, when the member of FIG. 11 and the member of FIG. 12 are stacked, the protruding island 1020 comes to a location between the penetrating grooves 2005.

The arrangement is not limited to that illustrated in FIGS. 12 and 13 so long as the protruding island 1020 can be supported. For example, the penetrating groove 2005 can be arranged in such a manner that it is orthogonal to the longitudinal direction of the protruding island 1020, or it intersects the protruding island 1020.

In this example, as described above, there is prepared the substrate structure including the seed substrate 1000, the etching sacrificial layer 1010, the compound semiconductor laminated layer 1020, the release layer 2010, and the first substrate 2000. The etchant can be introduced into the structure through the second groove 2005 penetrating the first substrate 2000 and the release layer 2010, and the third groove 2006. The etchant is thus brought into contact with the etching sacrificial layer 1010 to perform the etching process and separate the seed substrate 1000 from the substrate structure.

Although the first groove 1025 penetrates the etching sacrificial layer 1010 in FIG. 10, the first groove 1025 may or may not be used to penetrate the etching sacrificial layer 1010. Exposure of the etching sacrificial layer 1010 to the etchant is important.

The etching stop layer 1009 is only used according to necessity. Where the proceeding degree of etching is to be precisely managed timely, the etching stop layer can be omitted.

In the above transfer method, for example, when the LED is fabricated, the following compound semiconductor laminated layer is formed. P—AlAs layer (etching sacrificial layer) is formed on a p-type GaAs substrate (seed substrate), and the following layer are formed as the compound semiconductor laminated layer on the etching sacrificial layer. That is, p-type GaAs contact layer, p-type AlGaAs cladding layer, p-type AlGaAs active layer, n-type AlGaAs cladding layer, and n-type GaAs contact layer are deposited. Between the sacrificial layer and the compound semiconductor substrate, AlInGaP can be formed as the etching stop layer.

When the GaAs layer and AlGaAs layer are etched with a sulfuric acid, the etching stops at the AlInGaP layer. Thereafter, the AlInGaP layer is removed by hydrochloric acid. When the GaAs layer and AlGaAs layer are etched with ammonia and hydrogen peroxide, AlAs can be used as the stop layer.

As the material of the compound semiconductor laminated layer, in place of the above GaAs system, AlGaInP system, InGaAsP system, GaN system, AlGaN system, or InAlGaN system can be used, for example.

Further, at least one of metal layer and DBR mirror can be provided on the compound semiconductor laminated layer. The metal layer can be formed of Au, Ti or Al, for example. Material of the metal layer can be selected according to the light emitting wavelength of the LED. When a red system LED of 600 nm to 800 nm is fabricated, Au, Ag or the like can be used as a material having high reflectance. In the case of a blue system LED near 360 nm, Al can be used.

The DBR mirror can be comprised of a structure wherein AlAs layers and AlGaAs layers are alternately formed plural times for GaAs system compound semiconductor material, for example. Or, Al oxide layers and $Al_{0.2}Ga_{0.8}As$ layers are alternately formed. Because the aluminum oxide is difficult to form by the epitaxial growth, regulation of the refractive index can be executed by alternately changing a value of x in $Al_xGa_{1-x}As$ between 0.2 and 0.8.

Further, when the LED device is fabricated using the compound semiconductor laminated layer, a homo junction type LED can be adopted in place of the hetero junction type LED. In this case, after respective layers are formed by the epitaxial growth, pn-junction is formed in the active layer by impurity diffusion performed by the solid state diffusion method. To establish ohmic contact between a contact layer and a p-side or n-side electrode, the contact can have an impurity concentration higher than those of the cladding layers sandwiching the active layer.

Also in this first example, functional regions on the first substrate prepared as described above can be selectively transferred to another substrate with high accuracy owing to the presence of the release layer and the light blocking member.

Second example including the step of preparing the first substrate with functional regions will be described with reference to FIGS. 14A to 14D. In steps (an interface separation layer forming step, and a semiconductor layer forming step) of FIG. 14A, an interface separation layer 505 of a semiconductor layer (for example, InGaAs) is formed on a seed substrate 504 like a Ge substrate by the hetero epitaxial growth. The lattice constant and/or coefficient of thermal expansion of the semiconductor layer are different from those of the substrate 504. Then, a semiconductor layer 506 of GaAs or the like is formed on the interface separation layer 505. The separation layer 505 corresponds to the sacrificial layer described above.

Figure 14A:
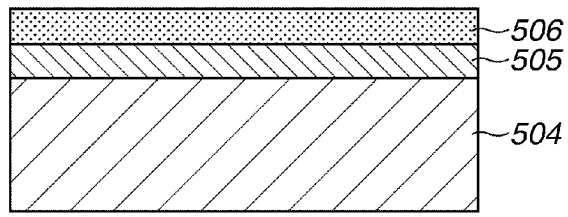
FIGS. 14A to 14D are cross-sectional views illustrating a step of preparing a first substrate in a second example of the transfer method according to the present invention.
Figure 14B:
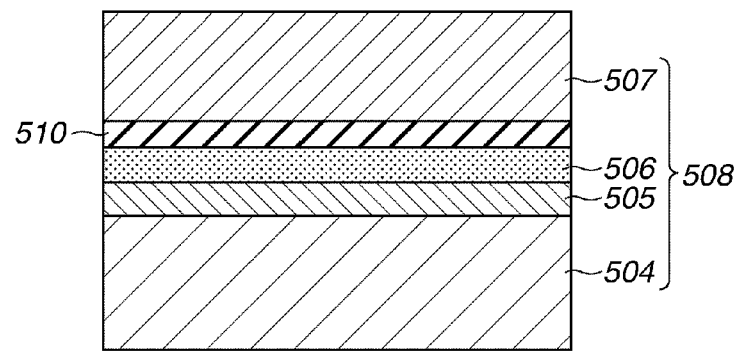

In a bonding step illustrated in FIG. 14B, the semiconductor layer 506 on the seed substrate 504 is bonded to a release layer 510 formed on a first substrate 507 of Si or the like to obtain a composite structure 508. The release layer 510 can be the above-described release layer.

Figure 14C:
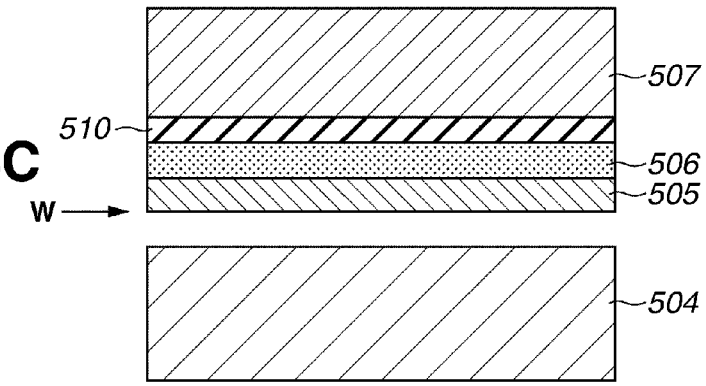
Figure 14D:
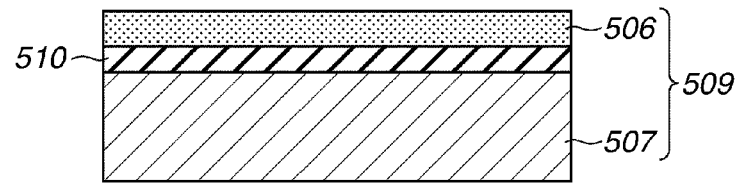

In a separating step of FIG. 14C, cracks extending in in-surface directions are generated in the interface separation layer 505, and/or an interface between the interface separation layer 505 and the semiconductor layer 506, and/or an interface between the interface separation layer 505 and the seed substrate 504. Thus, the semiconductor layer 506 and the first substrate 507 are separated from the composite structure 508. In the above steps, the semiconductor layer 506 is transferred from the seed substrate 504 to the first substrate 507. As illustrated in FIG. 14D, a substrate structure 509 comprised of the first substrate 507 with the release layer 510 and semiconductor layer 506 thereon can be obtained.

In the above steps, strain energy due to mismatch of the lattice constant and/or coefficient of thermal expansion is generated in a concentrated fashion in the interface separation layer 505, and/or the interface between the interface separation layer 505 and the semiconductor layer 506, and/or the interface between the interface separation layer 505 and the seed substrate 504. Thereafter, a separation inducing force is applied to the entire composite structure 508, or a portion thereof (for example, the interface separation layer 505, and/or the interface between the interface separation layer 505 and the semiconductor layer 506, and/or the interface between the interface separation layer 505 and the seed substrate 504). With the aid of the strain energy generated in the composite structure 508, the semiconductor layer 506 and first substrate 507 can be separated from the composite structure 508. Grooves are formed to divide the semiconductor layer 506 into plural island-like functional regions. Prior to the bonding step of FIG. 14B, the grooves can be formed to divide the semiconductor layer 506 into the island-like functional regions.

The seed substrate 504 can be formed of a single crystal material. In place of Ge, the seed substrate 504 can also be formed of $Al_2O_3$, SiC, GaAs, InP, or Si, for example. The interface separation layer 505 with the above-described lattice constant and/or coefficient of thermal expansion can be composed of a compound semiconductor material such as InGaAs, GaN, InGaN, AlGaN, AlN, AlAs, AlGaAs, InAlAs, InGaAlP, InGaAsP, or InGaP.

The semiconductor layer 506 can be composed of a compound semiconductor material including a material such as GaAs, GaN, AlGaAs, InP, InGaN, AlGaN, AlN, AlAs, InGaAs, InAlAs, InGaAlP, InGaAsP, or InGaP. The first substrate 507 can be formed of a semiconductor substrate of Si or the like, a metal substrate of Al, Cu, Cu—W or the like, an insulating substrate of glass or the like, or an elastic substrate of plastics or the like.

In the step of separating the semiconductor layer and first substrate from the composite structure 508, a fluid W (liquid or gas) can be blown to the interface separation layer 505 or its vicinity. Injection of the fluid W to the above-described location can generate cracks in the injected portion of the composite structure, leading to the above separation.

Also in the second example, functional regions on the first substrate prepared as described above can be selectively transferred to another substrate with high accuracy owing to the presence of the release layer and the light blocking member.

Figure 15:
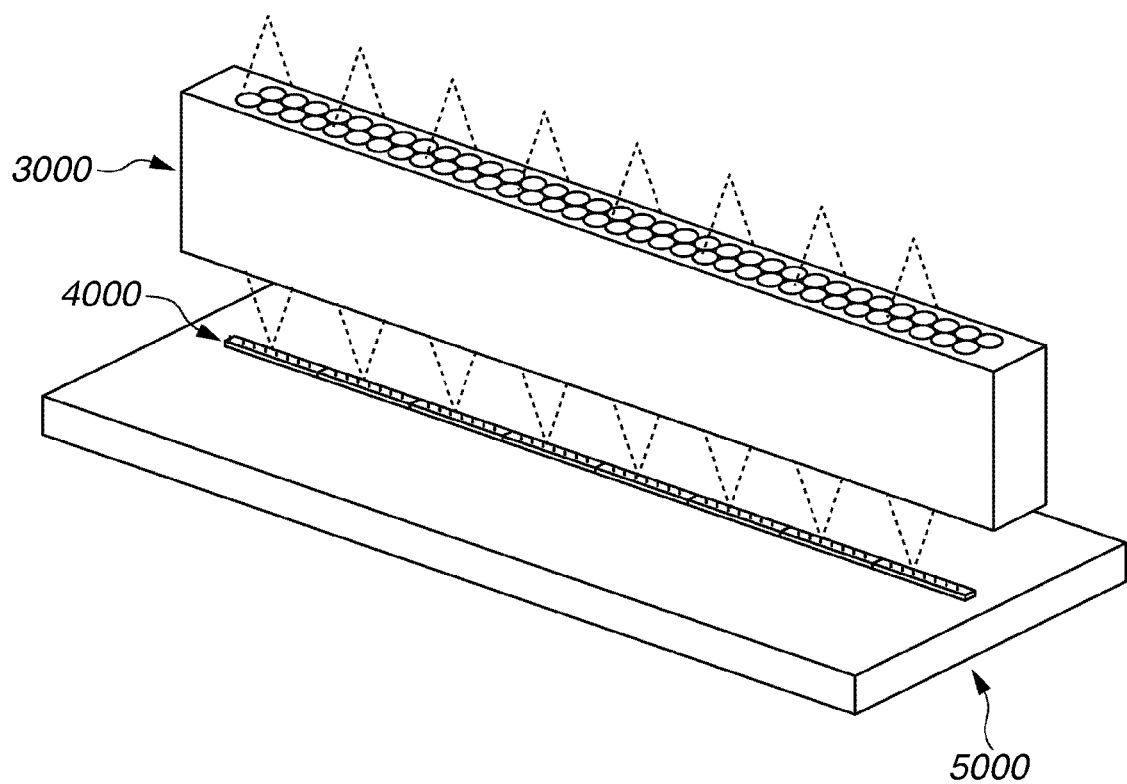
FIG. 15 is a perspective view illustrating an example of an LED printer head.

Description will be made to a third example directed to an LED array fabricated by the above transfer method. The LED array illustrated in FIG. 15 can be obtained by using the above transfer method. FIG. 15 shows a structure wherein the drive circuit and an LED array 4000 are connected and arranged on a print-circuit board 5000. The drive circuit and LED array can be obtained in the following manner. Plural LED devices are formed on the silicon substrate as illustrated in FIG. 8A, and plural portions acquired by division of the silicon substrate using dicing are arranged on the print-circuit board 5000. Cross sectional structures of each LED device and each drive circuit are similar to an LED device including an LED light emitting region and a driver circuit illustrated in FIG. 15 described below.

Figure 16:
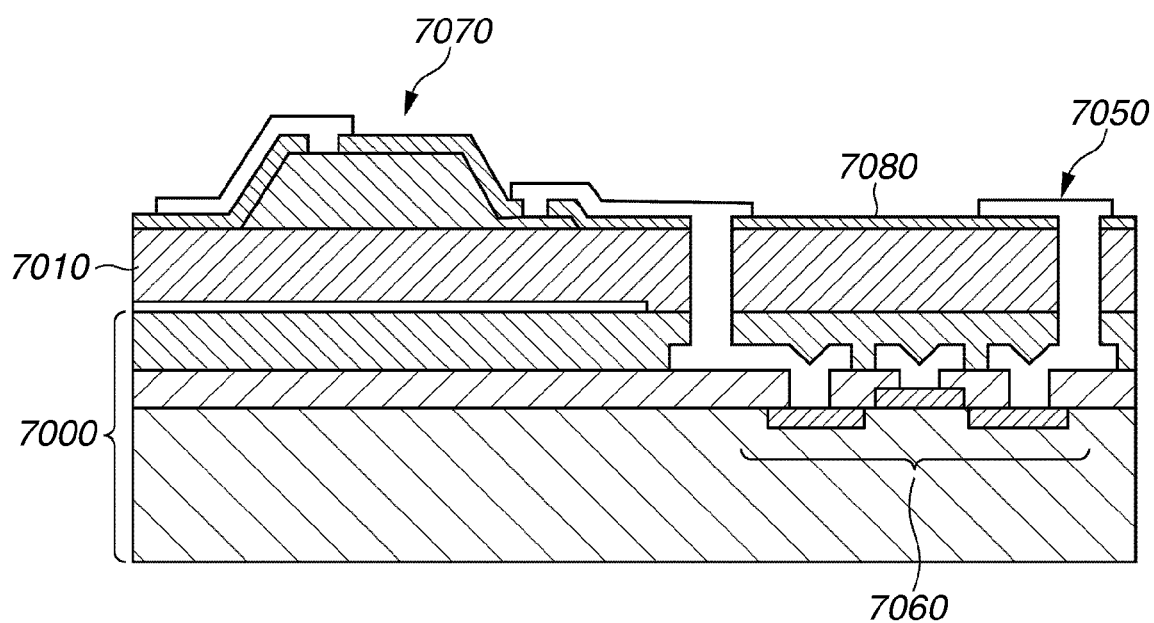
FIG. 16 is a cross-sectional view illustrating a manner in which a driver circuit formed directly in a Si substrate is connected to an LED device.

In the structure of FIG. 15, plural sets of LED array/drive circuits 4000 are linearly arranged on the print-circuit board 5000. In the LED array/drive circuit 4000, the LED device and the driver device of driver IC are electrically connected as illustrated in FIG. 16. A rod lens array 3000 (for example, SLA: Selfoc lens array) can be placed facing the LED array 4000 according to necessity. Thus, the LED printer head can be fabricated. Light emitted from the linearly-arranged LED array 4000 is condensed by the rod lens array 3000 to achieve image formation by the LED array.

Where LED device constituent layers are formed on the silicon substrate interposing a metal layer or DBR mirror therebetween, a fine light spot can be obtained owing to improvement of the directional property. In such a case, the LED printer head can be set up without using the rod lens array.

In a connecting configuration between the driver IC (driver circuit) and the LED device, the driver IC can be directly built in the silicon substrate, and connected to the LED device, as illustrated in FIG. 16. In the configuration of FIG. 16, an insulating layer 7010 of an organic material (see the bonding layer 205 in FIGS. 3A and 3B) is formed on a silicon substrate 7000 with a MOS transistor 7060 constituting the driver IC. An LED light emitting region 7070 including the compound semiconductor laminated layer is provided on the insulating layer 7010. Further, reference numeral 7080 denotes another insulating layer, reference numeral 7050 denotes a wire bonding pad forming a source or drain region of the MOS transistor 7060. Such a configuration can be fabricated from the structure of the second substrate 200 as illustrated in FIG. 3B, for example.

Figure 17:
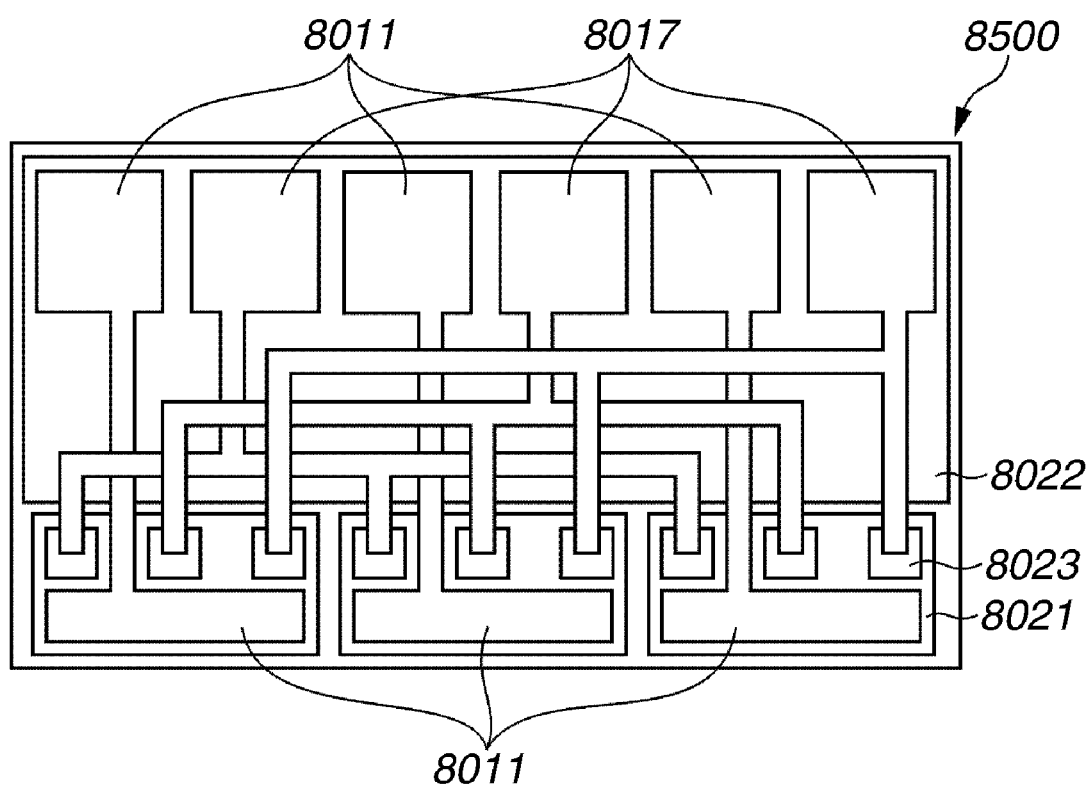
FIG. 17 is a plan view illustrating a light emitting device array circuit capable of being driven in a time sharing manner so that the number of electrodes can be reduced.

FIG. 17 illustrates a structure for matrix driving. A light emitting device array circuit 8500 in FIG. 17 can be driven in a time sharing manner for reducing the number of electrodes. In FIG. 17, reference numeral 8011 denotes an n-side electrode, reference numeral 8017 denotes a p-side electrode, reference numeral 8021 denotes an insulating layer on n-type AlGaAs, reference numeral 8022 denotes an insulating layer on p-type GaAs contact layer, and reference numeral 8023 denotes a light emitting region.

Low-cost high-performance LED array and LED printer head described above can be achieved by using the transfer method of the present invention.

Figure 18A:
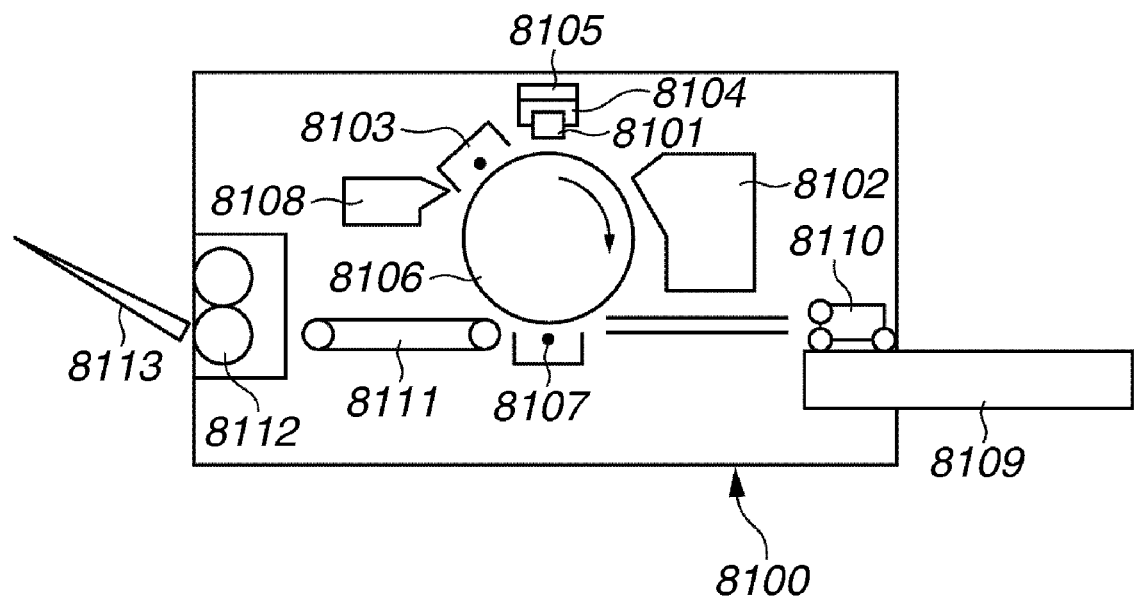
FIG. 18A is a view illustrating a configuration of an example of an LED printer.

FIG. 18A shows an example of an LED printer using the LED printer head described above. The LED printer includes the LED printer head, a photosensitive drum, and an electrostatic charging device. An image forming unit forms an electrostatic latent image on the photosensitive drum by using a light beam from a light source of the LED printer head.

In FIG. 18A of a schematic cross-sectional view showing a configuration of the LED printer, the photosensitive drum 8106 rotatable in a clockwise direction is placed in a printer body 8100. Above the photosensitive drum 8106, the LED printer head 8104 is arranged for exposure of the photosensitive drum. The LED printer head 8104 includes an LED array 8105 with plural light emitting diodes each emitting light according to an image signal, and a rod lens array 8101 for forming an image of radiation pattern of each light emitting diode on the photosensitive drum 8106. The rod lens array 8101 has the configuration described above. An image-formed plane of the light emitting diode is caused to coincide with a surface of the photosensitive drum 8106 by the rod lens array 8101. In other words, the optical conjugate relationship between the radiation surface of the light emitting diode and the photosensitive surface of the photosensitive drum is achieved by the rod lens array.

Around the photosensitive drum 8106, an electrostatic charging device 8103 for uniformly charging the surface of the photosensitive drum 8106, and a developing device 8102 for attaching toner to the photosensitive drum 8106 according to an exposure pattern by the printer head 8104 to form a toner image. There are further arranged a transfer electrostatic charging device 8107 for transferring the toner image to a transfer material like a copy sheet, and a cleaning portion 8108 for collecting waste toner remaining on the photosensitive drum 8106 subsequent to the transfer.

Further, in the printer body 8100, a sheet cassette 8109 for containing the transfer material, and a sheet feeding portion 8110 for feeding the transfer material to a location between the photosensitive drum 8106 and the electrostatic charging device 8107 are arranged. Furthermore, there are arranged a fixing device 8112 for fixing the transferred toner image on the transfer material, a conveying portion 8111 for conveying the transfer material to the fixing device 8112, and a sheet discharging tray 8113 for supporting the transfer material discharged subsequent to the fixation.

Figure 18B:
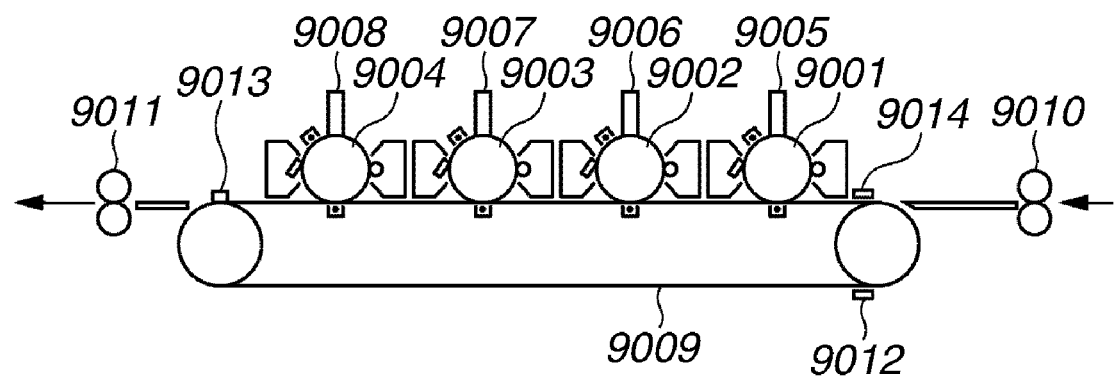
FIG. 18B is a view illustrating a configuration of an example of an LED color printer.
Figure 19A:
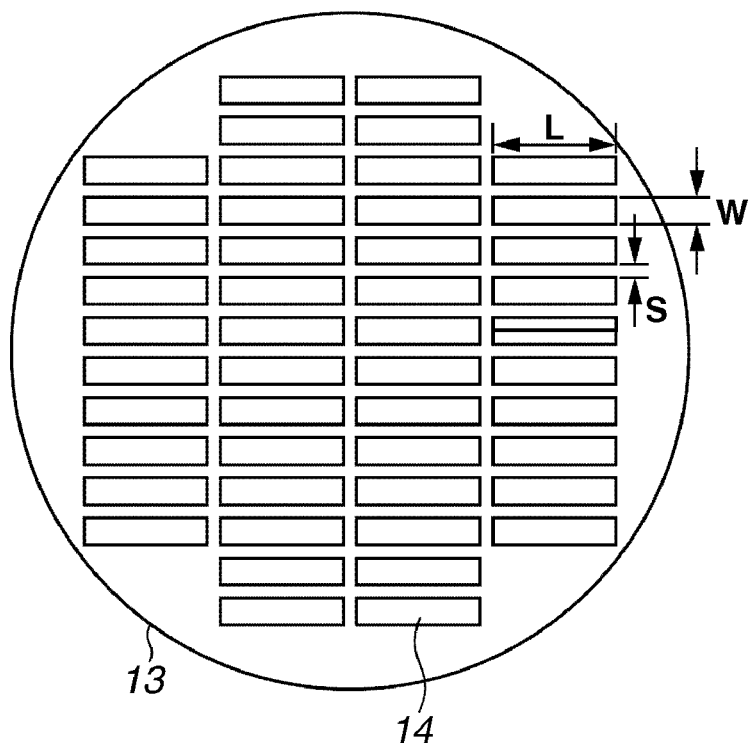
FIG. 19A is a plan view illustrating plural transfer expected regions on a substrate in a conventional example.
Figure 19B:
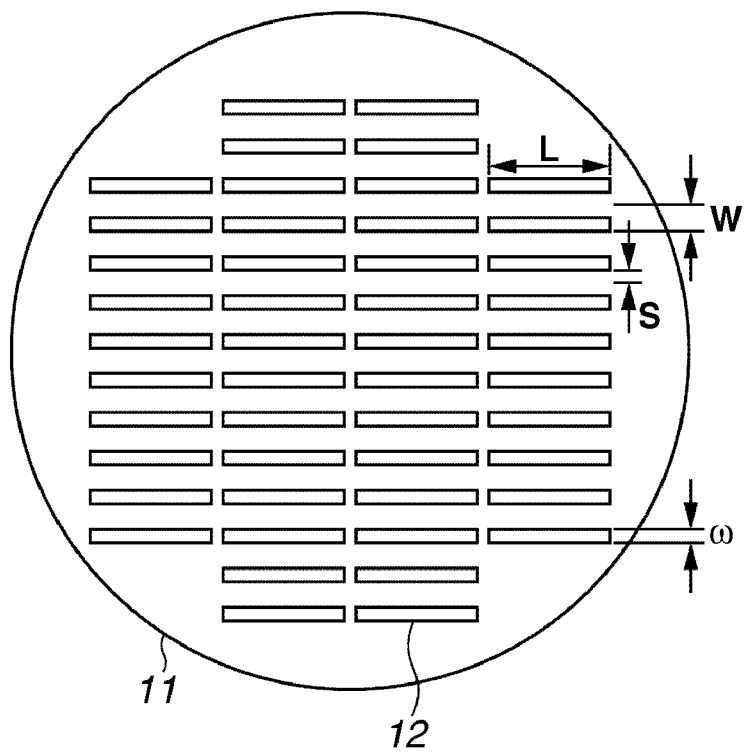
FIG. 19B is a plan view illustrating plural functional regions on a seed substrate in a conventional example.

An example of an LED color printer will be described. The LED color printer includes plural sets of the LED printer head, the photosensitive drum, the electrostatic charging device, and the image forming unit for forming the electrostatic latent image on the photosensitive drum by using the LED printer head as a light source. FIG. 18B shows a schematic configuration of the LED color printer. In FIG. 18B, reference numerals 9001, 9002, 9003 and 9004 denote photosensitive drums of magenta (M), cyan (C), yellow (Y), and black (K), respectively. Reference numerals 9005, 9006, 9007 and 9008 denote respective LED printer heads. Reference numeral 9009 denotes a conveyer belt for conveying the transfer material and bringing the transfer material into contact with respective photosensitive drums 9001, 9002, 9003 and 9004. Reference numeral 9010 denotes a registration roller for feeding the sheet, and reference numeral 9011 denotes a fixing roller.

Further, reference numeral 9012 denotes a charger for adsorption-supporting the transfer material on the conveyer belt 9009, reference numeral 9013 denotes a charge eliminating device, and reference numeral 9014 denotes a sensor for detecting a leader of the transfer material.

As described in the foregoing, owing to the transfer method of the present invention, the seed substrate like the GaAs substrate can be efficiently used, and reused. Further, the functional region can be selectively transferred with high reliability, and hence low-cost high-performance LED array, LED printer head, LED printer and the like can be provided.

The present invention can be applied to an array device wherein semiconductor devices are arranged in an array on a semiconductor substrate, an LED printer using LED devices formed on a semiconductor substrate, a display apparatus using LED devices formed on a semiconductor substrate, manufacture of an optical transceiver device and an optical receiver device, and the like. In the case of the optical receiver device, a reliable scanner can be provided.

Except as otherwise discussed herein, the various components shown in outline or in block form in the Figures are individually well known and their internal construction and operation are not critical either to the making or using, or to a description of the best mode of the invention.

This application claims the benefit of Japanese Patent Application No. 2008-282681, filed Nov. 4, 2008, which is hereby incorporated by reference herein in its entirety.

What is claimed is:

1. A method comprising:
arranging a first bonding layer of a predetermined thickness on at least one of a first functional region and a second functional region bonded on a release layer, on a first substrate, and a region, to which the first functional region is to be transferred, on a second substrate, the release layer including a material whose decomposition or decrease in bonding strength occurs when irradiated with light;
bonding the first functional region to the second substrate through the first bonding layer;
irradiating the release layer with light with a light blocking member toward a region on the first substrate, other than a region on which the first functional region exists, being provided to separate the first substrate from the first functional region at the release layer;
arranging a second bonding layer of a predetermined thickness on at least one of the second functional region on the first substrate, and a region, to which the second functional region is to be transferred, on the second substrate or a region, to which the second functional region is to be transferred, on a third substrate;
bonding the second functional region to the second substrate or the third substrate through the second bonding layer; and
subjecting the release layer to irradiation with light or change in temperature to separate the first substrate from the second functional region at the release layer.

2. The method according to claim 1, wherein the release layer is irradiated with light with the light blocking member being removed or changed in position.

3. The method according to claim 1, wherein the light blocking member is a stencil mask.

4. The method according to claim 1, wherein the release layer includes a layer of a material whose decomposition or decrease in bonding strength occurs at a predetermined temperature, and the release layer is maintained at a temperature above a predetermined temperature for a predetermined time.

5. The method according to claim 1, further comprising forming a predetermined unevenness on a region on the second substrate, other than the region to which the first functional region is to be transferred, or a region on the third substrate, other than the region to which the second functional region is to be transferred.

6. The method according to claim 1, wherein the first and second functional regions are arranged on the first substrate at a predetermined inter-distance, regions each of which is to be connected to the first functional region transferred to the second substrate are arranged on the second substrate at a predetermined inter-distance.

7. The method according to claim 6, wherein relations 1 to 3 are satisfied $$l < \text{or} = L \quad \text{(relation 1)}$$

$$W > w \quad \text{(relation 2)}$$

$$W + S > w + s \quad \text{(relation 3)}$$

where w is the width of each of the first and second functional regions on the first substrate, l is the length of each functional region, s is the distance between the functional regions, W is the width of the region to be connected to the first functional region transferred to the second substrate, L is the length of the region on the second substrate, and S is the distance between the regions on the second substrate.

8. The method according to claim 1, wherein the second or third substrate includes a third functional region, and the first functional region is connected to the third functional region through the first bonding layer.

9. The method according to claim 1, wherein the second or third substrate includes a fourth functional region, and the second functional region is connected to the fourth functional region through the second bonding layer.

10. The method according to claim 1, wherein the first functional region is bonded to the second substrate through the first bonding layer which is a release layer capable of falling into a releasable condition when subjected to a process.

11. The method according to claim 10 further comprising: arranging a third bonding layer of a predetermined thickness on at least one of the first functional region on the second substrate, and a region, to which the first functional region is to be transferred, on a fourth substrate; bonding the first functional region on the second substrate to the fourth substrate through the third bonding layer; and separating the second substrate from the first functional region at the first bonding layer.

12. The method according to claim 1, wherein the second functional region is bonded to the third substrate through the second bonding layer which is a release layer capable of falling into a releasable condition when subjected to a process.

13. The method according to claim 12, further comprising: arranging a fourth bonding layer of a predetermined thickness on at least one of the second functional region on the third substrate, and a region, to which the second functional region is to be transferred, on a fifth substrate; bonding the second functional region on the third substrate to the fifth substrate through the fourth bonding layer; and separating the third substrate from the second functional region at the second bonding layer.

14. The method according to claim 1, wherein the first or second functional region on the first substrate includes a compound semiconductor layer, and the first substrate is prepared by preparing a substrate structure in which the first or second functional region is formed by providing an etching sacrificial layer, the compound semiconductor layer, the release layer, and the first substrate on a compound semiconductor substrate in this order.

15. The method according to claim 14, wherein a first groove is formed in the compound semiconductor layer, and a second penetrating groove is formed at least one of the first substrate and the compound semiconductor substrate so that the second penetrating groove is connected to the first groove.

16. The method according to claim 15 further comprising separating the compound semiconductor substrate from the substrate structure by bringing an etchant into contact into the etching sacrificial layer through the first groove and the second penetrating groove to etch the etching sacrificial layer.

17. The method according to claim 1, wherein the first or second functional region includes a compound semiconductor layer, and the first substrate is prepared by: forming an interface separation layer on a seed substrate by a hetero epitaxial growth, forming the compound semiconductor layer on the interface separation layer, bonding the seed substrate with the interface separation layer and the compound semiconductor layer to the first substrate through the release layer, and separating the first substrate with the release layer and the compound semiconductor layer from a composite structure obtained by the bonding, utilizing the interface separation layer, to obtain the first substrate with the compound semiconductor layer.

* * * * *